(12) United States Patent
Lee et al.

(10) Patent No.: US 11,497,094 B2
(45) Date of Patent: Nov. 8, 2022

(54) LED LIGHTING APPARATUS

(71) Applicant: SAMSUNG ELECTRONICS CO., LTD., Suwon-si (KR)

(72) Inventors: Seulgee Lee, Suwon-si (KR);
Seongmin Kim, Seongnam-si (KR);
Chohui Kim, Hwaseong-si (KR);
Jeongeun Yun, Hwaseong-si (KR);
Sungwoo Choi, Suwon-si (KR);
Jeongrok Oh, Suwon-si (KR); Chulsoo Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/500,571

(22) Filed: Oct. 13, 2021

(65) Prior Publication Data

US 2022/0210881 A1    Jun. 30, 2022

(30) Foreign Application Priority Data

Dec. 31, 2020    (KR) .......................... 10-2020-0189659

(51) Int. Cl.
| | |
|---|---|
| *H05B 45/20* | (2020.01) |
| *H05B 45/30* | (2020.01) |
| *H05B 45/10* | (2020.01) |
| *H01L 33/50* | (2010.01) |
| *F21K 9/64* | (2016.01) |
| *F21Y 115/10* | (2016.01) |

(52) U.S. Cl.
CPC ............... *H05B 45/20* (2020.01); *F21K 9/64* (2016.08); *H01L 33/504* (2013.01); *H05B 45/10* (2020.01); *H05B 45/30* (2020.01); *F21Y 2115/10* (2016.08)

(58) Field of Classification Search
CPC ........ H05B 45/10; H05B 45/20; H05B 45/30; H01L 33/504; H01L 33/12; H01L 33/22; F21K 9/64; F21Y 2115/10
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |

(Continued)

FOREIGN PATENT DOCUMENTS

| | | |
|---|---|---|
| EP | 3 511 618 A1 | 7/2019 |
| JP | 6145679 B2 | 6/2017 |

(Continued)

*Primary Examiner* — Haissa Philogene
(74) *Attorney, Agent, or Firm* — Sughrue Mion, PLLC

(57) ABSTRACT

An LED lighting apparatus, including an LED light source configured to emit white light having a first melanopic/photopic (M/P) ratio; a tuning LED light source configured to emit tuning blue light having a peak wavelength in a range of 465 nm to 495 nm; and a driving control unit configured to control currents respectively applied to the LED light source and the tuning LED light source to generate tuned white light having a second M/P ratio higher than the first M/P ratio

20 Claims, 15 Drawing Sheets

(56) References Cited

U.S. PATENT DOCUMENTS

| | | |
|---|---|---|
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,404,652 B2 | 7/2008 | Ng et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,217,404 B2 | 7/2012 | Wu et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,860,955 B2 * | 1/2018 | Kim ..................... H05B 45/20 |
| 10,816,939 B1 * | 10/2020 | Coleman ................ G01S 17/86 |
| 2011/0068702 A1 * | 3/2011 | van de Ven ........... H05B 45/10 |
| | | 315/186 |
| 2012/0256212 A1 * | 10/2012 | Yeh ................... C09K 11/0883 |
| | | 252/301.4 F |
| 2013/0139437 A1 * | 6/2013 | Maxik .................... H05B 47/10 |
| | | 47/58.1 LS |
| 2014/0217907 A1 * | 8/2014 | Harris ................... H05B 45/38 |
| | | 315/186 |
| 2015/0097200 A1 * | 4/2015 | Bergmann ............ H01L 33/50 |
| | | 257/89 |
| 2018/0073689 A1 * | 3/2018 | Soer ...................... F21V 23/003 |
| 2018/0177017 A1 * | 6/2018 | Soler ..................... A61M 21/00 |
| 2018/0338359 A1 | 11/2018 | Soler |
| 2019/0131502 A1 | 5/2019 | Moon et al. |

FOREIGN PATENT DOCUMENTS

| | | |
|---|---|---|
| JP | 2019-216205 A | 12/2019 |
| KR | 10-2146430 B1 | 8/2020 |

* cited by examiner

LED LIGHTING APPARATUS

CROSS-REFERENCE TO RELATED APPLICATION

This application claims is based on and claims priority under 35 U.S.C. § 119 to Korean Patent Application No. 10-2020-0189659 filed on Dec. 31, 2020 in the Korean intellectual Property Office, the disclosure of which is incorporated by reference herein in its entirety.

BACKGROUND

1. Field

The disclosure relates to a light emitting diode (LED) lighting apparatus.

2. Description of Related Art

A white light emitting device is implemented by applying a plurality of wavelength conversion materials such as a phosphor, for example, green, red or blue, yellow, and red, to an ultraviolet or blue LED chip. In a white lighting field, there has been recent demand for a human-centric LED lighting apparatus and a white light emitting device for use in the human-centric LED lighting apparatus.

SUMMARY

Provided are an LED lighting apparatus for human-centric lighting.

In accordance with an aspect of the disclosure, a light emitting diode (LED) lighting apparatus includes a first LED light source configured to emit first white light and including: a first light emitting diode configured to emit first blue light having a peak wavelength in a range of 435 nm to 465 nm, a second light emitting diode configured to emit second blue light having a peak wavelength in a range of 465 nm to 495 nm, a first wavelength conversion material configured to be excited by the first blue light and the second blue light and to emit first light having a peak wavelength in a range of 520 nm to 560 nm, and a second wavelength conversion material configured to be excited by the first and second blue lights and to emit second light having a peak wavelength ranging from 600 nm to 645 nm; a second light source configured to emit a second white light and including: a third light emitting diode configured to emit third blue light having the peak wavelength in the range of 435 nm to 465 nm, a third wavelength conversion material configured to be excited by the third blue light and to emit third light having a peak wavelength in a range of 540 nm to 560 nm and having a full width at half maximum of 60 nm or less, and a fourth wavelength conversion material configured to be excited by the third blue light and to emit fourth light having a peak wavelength in a range of 620 nm to 650 nm; a tuning LED light source configured to emit tuning blue light having the peak wavelength in the range of 465 nm to 495 nm; and a driving control unit configured to control currents respectively applied to the first LED light source, the second LED light source, and the tuning LED light source to generate tuned white light In accordance with an aspect of the disclosure, an LED lighting apparatus includes a first LED light source configured to emit first white light and including: a first light emitting diode configured to emit first blue light having a peak wavelength in a range of 435 nm to 465 nm, a second light emitting diode configured to emit second blue light having a peak wavelength in a range of 465 nm to 495 nm, a first wavelength conversion material configured to be excited by the first and second blue lights and to emit first light having a peak wavelength in a range of 520 nm to 560 nm, and a second wavelength conversion material configured to be excited by the first and second blue lights and to emit second light having a peak wavelength in a range of 600 nm to 645 nm; a second LED light source configured to emit second white light and including: a third light emitting diode configured to emit third blue light having the peak wavelength in the range of 435 nm to 465 nm, a third wavelength conversion material configured to be excited by the third blue light and to emit third light having a peak wavelength in a range of 540 nm to 560 nm and having a full width at half maximum of 60 nm or less, and a fourth wavelength conversion material configured to be excited by the third blue light and to emit fourth light having a peak wavelength in a range of 620 nm to 650 nm; and a driving control unit configured to control currents respectively applied to the first LED light source and the second LED light source to generate tuned white light.

In accordance with an aspect of the disclosure, an LED lighting apparatus includes an LED light source configured to emit white light having a first melanopic/photopic (M/P) ratio; a tuning LED light source configured to emit tuning blue light having a peak wavelength in a range of 465 nm to 495 nm; and a driving control unit configured to control currents respectively applied to the LED light source and the tuning LED light source to generate tuned white light having a second M/P ratio higher than the first Ml/P ratio.

In accordance with an aspect of the disclosure, an LED lighting apparatus includes at least two from among a first LED light source configured to emit first white light, a second LED light source configured to emit a second white light, and a tuning LED light source configured to emit a tuning blue light; and a driving control unit configured to control currents respectively applied to the at least two from among the first LED light source, the second LED light source, and the tuning LED light source to generate tuned white light including a combination of at least two from among the first white light, the second white light, and the tuning blue light, wherein the first LED light source includes: a first light emitting diode configured to emit first blue light having a peak wavelength in a range of 435 nm to 465 nm, a second light emitting diode configured to emit second blue light having a peak wavelength in a range of 465 nm to 495 nm, a first wavelength conversion material configured to be excited by the first blue light and the second blue light and to emit first light having a peak wavelength in a range of 520 nm to 560 nm, and a second wavelength conversion material configured to be excited by the first and second blue lights and to emit second light having a peak wavelength ranging from 600 nm to 645 nm, wherein the second LED light source includes: a third light emitting diode configured to emit third blue light having the peak wavelength in the range of 435 nm to 465 nm, a third wavelength conversion material configured to be excited by the third blue light and to emit third light having a peak wavelength in a range of 540 nm to 560 nm and having a full width at half maximum of 60 nm or less, and a fourth wavelength conversion material configured to be excited by the third blue light and to emit fourth light having a peak wavelength in a range of 620 nm to 650 nm, and wherein the tuning LED light source is configured to emit the tuning blue light having the peak wavelength in the range of 465 nm to 495 nm.

BRIEF DESCRIPTION OF DRAWINGS

The above and other aspects, features, and advantages of certain embodiments of the present disclosure will be more apparent from the following description, taken in conjunction with the accompanying drawings, in which.

DETAILED DESCRIPTION

Hereinafter, example embodiments will be described with reference to the accompanying drawings.

As is traditional in the field, embodiments may be described and illustrated in terms of blocks which carry out a described function or functions. These blocks, which may be referred to herein as units or modules or the like, or by names such as driver, controller, device, or the like, may be physically implemented by analog or digital circuits such as logic gates, integrated circuits, microprocessors, microcontrollers, memory circuits, passive electronic components, active electronic components, optical components, hard-wired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

Figure 1:
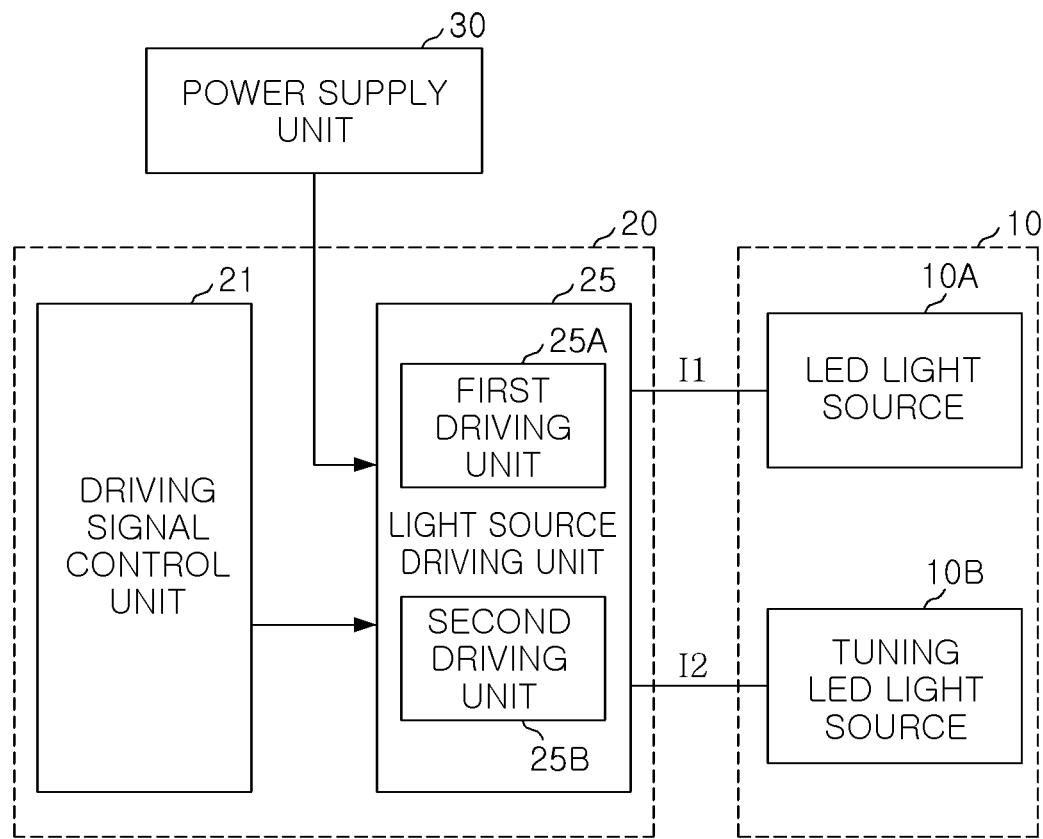
FIG. 1 is a block diagram of an LED light apparatus according to an embodiment.

FIG. 1 is a block diagram of an LED lighting apparatus according to an example embodiment.

Referring to FIG. 1, an LED lighting apparatus according to an example embodiment may include a light source unit 10, a driving control unit 20, and a power supply unit 30. The light source unit 10 may be configured as a separate module, or the light source unit 10 and the driving control unit 20 may be configured as a single module.

The light source unit 10 may include an LED light source 10A and a tuning LED light source 10B. The LED light source 10A and the tuning LED light source 10B may independently operate using applied currents I1 and I2, respectively. The LED light source 10A may emit white light having a correlated color temperature (CCT). For example, the LED light source 10A may emit white light having a color temperature ranging from 1800K to 6500K. In another embodiment, the LED light source 10A may be provided as two or more LED light sources emitting white lights having different color temperatures. The tuning LED light source 10B may adjust intensity in a melanopic sensitive zone, which may be denoted as "MS" in FIG. 5 and other figures, as discussed below, of white light emitted from the LED light source 10A. Accordingly, the light source unit 10 may emit white light in which the intensity of the melanopic sensitive zone, affecting human circadian rhythms, is adjusted.

The driving control unit 20 may include a driving signal control unit 21 and a light source driving unit 25. The driving signal control unit 21 may transmit a driving signal of the light source unit 10 to the light sFource driving unit 25. The driving signal control unit 21 may control currents I1 and I2 supplied from the light source driving unit 25 to the light source unit 10. The light source driving unit 25 may include a first driving unit 25A, which may drive the LED light source 10A, and a second driving unit 25B, which may drive the tuning LED light source 10B. For example, the first driving unit 25A and the second driving unit 25B may supply the currents I1 and I2, controlled by the driving signal of the driving signal control unit 21, to the LED light source 10A and the tuning LED light source 10B. The light source driving unit 25 may receive AC or DC power from the power supply unit 30.

As an example, the driving control unit 20 may further include a communications module, transmitting and receiving data of color characteristics such as a measured color temperature, inside or outside the LED lighting apparatus. The driving control unit 20 may further include a signal processing unit processing data from at least one of an illuminance sensor, a motion sensor, and an image sensor and transmitting and receiving the processed data to and from the inside or outside of the driving control unit 20.

In an example embodiment, the LED lighting apparatus may include an LED light source configured to emit white light having a first melanopic/photopic (M/P) ratio, a tuning LED light source configured to emit tuning blue light having a peak wavelength ranging from 465 nm (nanometer, or one billionth of a meter) to 495 nm, and a driving control unit driving currents, respectively applied to the LED light source and the tuning LED light source, to generate tuned white light a second M/P ratio higher than the first M/P ratio. According to the configuration of the LED light source, the first M/P ratio may range from about 0.2 to 1.2, for example, when including the first and second light emitting devices of FIGS. 2A and 2B, an example of which is presented as Example 3, or may range from about 0.6 1.2, for example when including the first light emitting device of FIG. 2A, an example of which is presented as Example 1), or may range from about 0.1 to 0.7, for example when including the second light emitting device of FIG. 2B, an example of which is presented as Example 2. In addition, the second M/P ratio corresponding to each of the first M/P ratios may range from about 0.3 to 2.6, as shown for example in Example 4, or may range from about 0.6 to 2.5, as shown for example in Example 1, or may range from 0.2 to 2 as shown for example in Example 2.

In embodiments, when a light is described as having a peak wavelength "ranging from" a first wavelength to a second wavelength, this may mean that the light may have a peak wavelength that is in a range of, or within a range of, the first wavelength to the second wavelength, and may therefore be any wavelength between the first wavelength and the second wavelength, inclusive.

Hereinafter, a light emitting device adoptable to the LED light source 10A will be described with reference to FIGS. 2A to 2C together with FIG. 1.

Figure 2A:
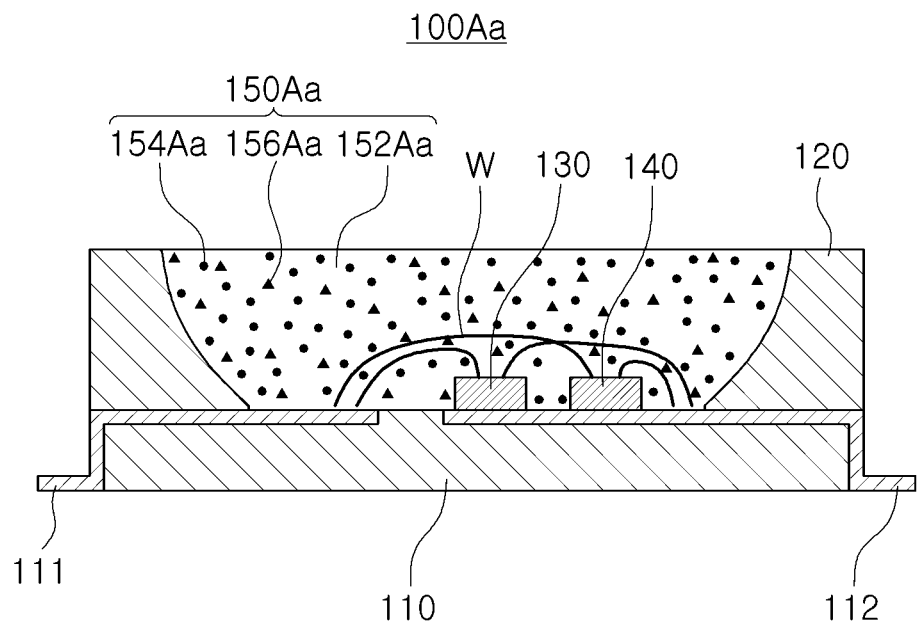
FIGS. 2A and 2B are cross-sectional views of light emitting devices, respectively adoptable to an LED light source, according to an embodiment.
Figure 2B:
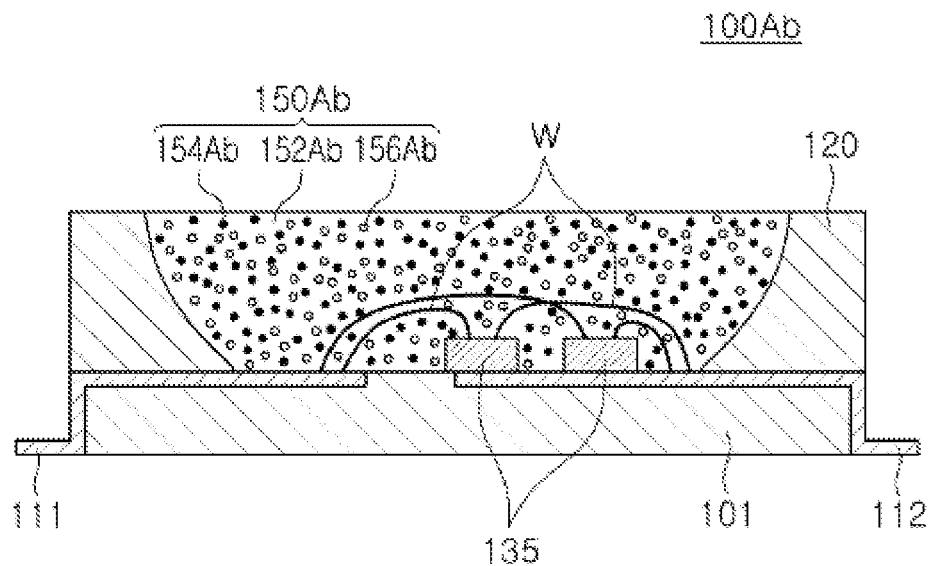
Figure 2C:
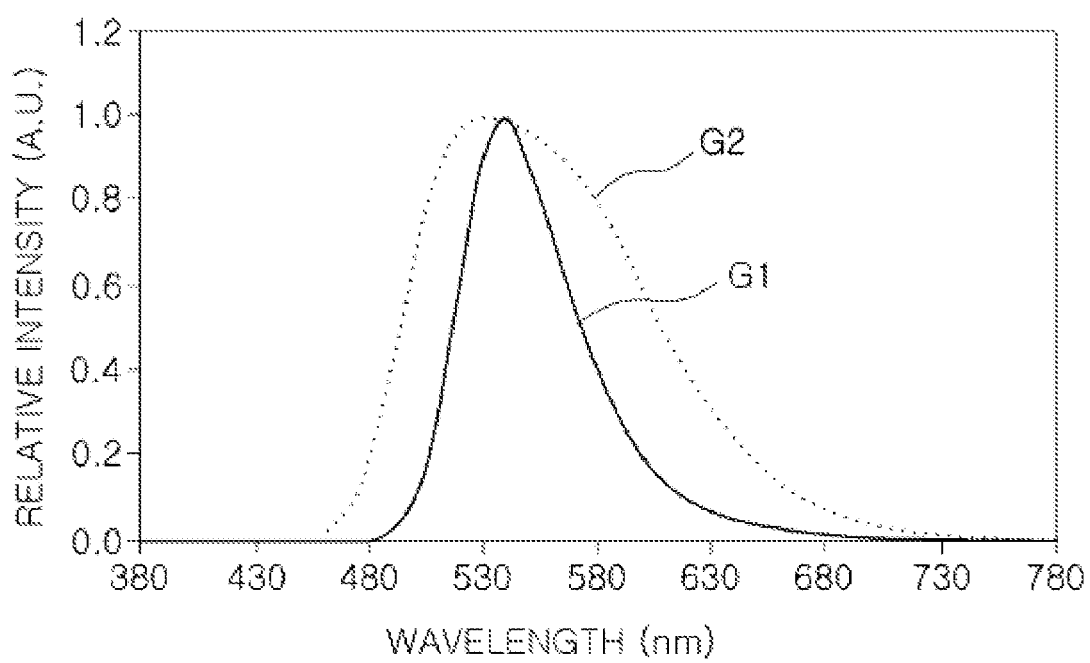
FIG. 2C is a graph illustrating emission spectra of wavelength conversion materials adoptable to a light emitting device illustrated in FIG. 2B, according to an embodiment.

FIGS. 2A and 2B are cross-sectional views of light emitting devices 100Aa and 100Ab, respectively adoptable to an LED light source, for example LED light source 10A, in the embodiment of FIG. 1, and FIG. 2C is a graph illustrating emission spectra of wavelength conversion materials adoptable to the light emitting device of FIG. 2B. The LED light source of FIG. 1 may include at least one of first light emitting device 100Aa and second light emitting device 100Ab, respectively emitting first and second white lights having different color temperatures, M/P ratios, and the like.

Referring to FIG. 2A, an LED light source, or a first LED light source, may include: first white light emitting device 100Aa emitting white light having a first M/P ratio, which may be, for example, about 0.6 to 1.2 as shown in Example 1. The first white light emitting device 100Aa may include a package substrate 110, a sidewall reflection unit 120, a first light emitting diode 130, a second light emitting diode 140, and a wavelength conversion unit 150Aa.

The package substrate 110 may include first and second electrode structures 111 and 112 electrically connected to the first and second light emitting diodes 130 and 140. The package substrate 110 may be molded using an opaque resin or a resin having high reflectivity, may facilitate an injection process, and may include a polymer resin containing highly reflective powder. In embodiments, the package substrate 101 may be formed of ceramic. In this case, heat may be easily dissipated. As an example, the package substrate 110 may be a printed circuit board on which an interconnection pattern, replacing the first and second electrode structures 111 and 112, is formed.

The sidewall reflection unit 120 may be disposed on the package substrate 110 and may have a cavity accommodating the first and second light emitting diodes 130 and 140, or the third electrodes 135. The sidewall reflection unit 120 may have a cup shape to improve light reflection efficiency, but example embodiments are not limited thereto. As an example, the sidewall reflection unit 120 may be formed to be integrated with the package substrate 110. For example, the sidewall reflection unit 120 and the package substrate 110 may be formed of the same material, for example, a resin containing highly reflective white powder, through the same process, for example, an injection molding process.

The first and second light emitting diodes 130 and 140 may be electrically connected to the first and second electrode structures 111 and 112, respectively. In an example embodiment, the first and second light emitting diodes 130 and 140 are electrically connected to the first and second electrode structures 111 and 112 respectively by a conductive wire W, but example embodiments are not limited thereto and the first and second light emitting diodes 130 and 140 may be connected in a flip-chip manner. The first light emitting diode 130 may be configured to emit first blue light having a peak wavelength ranging from 435 nm to 465 nm, and the second light-emitting diode 140 may be configured to emit second blue light having a peak wavelength ranging from 465 nm to 495 nm.

The wavelength conversion unit 150Aa may include at least one of a light-transmitting resin 152Aa and first and second wavelength conversion materials 154Aa and 156Aa. The light-transmitting resin 152Aa may be formed of epoxy, silicone, modified silicone, a urethane resin, an oxetane resin, acrylic, polycarbonate, polyimide, and combinations thereof. The first and second wavelength conversion materials 154Aa and 156Aa may be excited by the first and second blue lights, generated from the first and second light emitting diodes 130 and 140, to emit lights having wavelengths different from those of the first and second blue lights. For example, the first wavelength conversion material 154Aa may be excited by at least one of the first and second blue lights to emit first light having a peak wavelength of 520 nm to 560 nm, and the second wavelength conversion material 156Aa may be excited by at least one of the first and second blue lights to emit second light having a peak wavelength of 600 nm to 645 nm. The first wavelength conversion material 154Aa may include at least one phosphor selected from the group consisting of for example, $(Ga,Gd,Y)_2Al_5O_{12}$:Ce, $La_3Si_6Ni$:Ce, $(Sr,Ca,Ba)Si_2O_2N_2$:Eu, $(Sr,Ba)Si_{20}O_4$:Eu, and combinations thereof. The second wavelength conversion material may include at least one phosphor selected from the group consisting of, for example, $(Sr,Ca)AlSiN_3$:Eu, $CaAlSiN_3$:Eu, $K_xSiF_y$:$Mn^{4+}$ (where $2 \leq x \leq 3$, and where $4 \leq y \leq 7$), $SrAl_2Li_2O_2N_2$, MGF:$Mn^{4+}$, and combinations thereof. At least one of the first and second wavelength conversion materials 154Aa and 156Aa may have an excitation efficiency obtained by the first blue light that is higher than an excitation efficiency obtained by the second blue light. In an example embodiment, the first and second wavelength conversion materials 154Aa and 156Aa may be dispersed in the light-transmitting resin 152Aa, but example embodiments are not limited thereto. In one example, the first and second wavelength conversion materials 154Aa and 156Aa may be provided as being surrounded by surfaces of the first and second light emitting diodes 130 and 140.

The first white light emitting device 100Aa may emit first white light in which first and second lights, converted by the first and second wavelength conversion materials 154Aa and 156Aa, and other unconverted first and second blue lights are combined. In an example embodiment, the first white light may be configured to have an emission spectrum satisfying a specific condition in consideration of blue light hazard (BLH), a circadian rhythm, and the like. An example of this will be described in detail in relation to Example 3 below.

Referring to FIG. 2B, an LED light source, or a second LED light source, 100Ab may include a second white light emitting device emitting second white light having a first M/P ratio, for example, in a range of about 0.1 to about 0.7 as shown for example in Example 2). The second light emitting device 100Ab may include a package substrate 110, a sidewall reflection unit 120, at least one third light emitting diode 135, and a wavelength conversion unit 150Ab. For example, the second white light emitting device 100Ab may include one or two third light emitting diodes 135 having a peak wavelength ranging from 435 nm to 465 nm. Components, other than the wavelength conversion unit 150Ab, have the same or similar features as those of FIG. 2A designated by the same reference numerals, so that duplicate descriptions will be omitted.

The wavelength conversion unit 150Ab may include a light-transmitting resin 152Ab and third and fourth wavelength conversion materials 154Ab and 156Ab. The third and fourth wavelength conversion materials 154Ab and 156Ab may be excited by third blue light, generated from the third light emitting diode 135, to emit lights having wavelengths different from a wavelength of the third blue light. For example, the third wavelength conversion material 154Ab may be excited by the third blue light to emit third light having a peak wavelength ranging from 540 nm to 560 nm and a full width at half maximum of 60 nm or less, and the fourth wavelength conversion material 156Ab may be excited by the third blue light to emit fourth light having a peak wavelength ranging from 620 nm to 650 nm. The third blue light, generated from the third light emitting diode 135, may have a peak wavelength ranging from 435 nm to 465 nm.

The third wavelength conversion material 154Ab may be configured to emit green light having a slightly higher peak wavelength than a conventional green wavelength conversion material to reduce a range of 465 nm to 495 nm at a spectrum of final white light. The third wavelength conversion material 154Ab may include, for example, $\beta\text{-Si}_{6-z}\text{Al}_z\text{O}_z\text{N}_{8-z}\text{Eu}^{2+}_2$ (where $0.01 \leq z \leq 5.99$) which may also be referred to as a "β-SiAlON" phosphor. Referring to FIG. 2C together, a spectrum G1 formed by the β-SiAlON phosphor may have a smaller full width at half maximum than a full width at half maximum, for example, about 60 nm or more, of a spectrum G2 formed by another green phosphor, for example a silicate phosphor. The spectrum G1 formed by the β-SiAlON phosphor may have a full width at half maximum of about 60 nm or less, for example, between about 60 nm to 35 nm, or between about 60 nm to 45 nm. As described above, in an example embodiment, the third wavelength conversion material 154Ab having a full width at half maximum of 60 nm or less may be used to sufficiently reduce the intensity of the region of 465 nm to 495 nm at a white light spectrum of the LED light source. On the other hand, the spectrum G1 formed by the β-SiAlON phosphor may have significantly low intensity at a wavelength of 480 nm. For example, the third wavelength conversion material 154Ab may have an emission spectrum having intensity of 10% or less, or 5% or less, and further, low intensity of 2% or less, as compared with the peak intensity at a wavelength of 480 nm. The third wavelength conversion material 154Ab may include a ceramic phosphor and/or a quantum dot, satisfying the above-described peak wavelength and full width at half maximum conditions, other than the β-SiAlON phosphor. For example, quantum dots may include InP/ZnS, InP/ZnSe, CdSe/CdS, CdSe/ZnS, Ph S/ZnS, InP/ZnSe/ZnS, InP/GaP/ZnS, and combinations thereof.

The fourth wavelength conversion material 156Ab may be selected as a material for compensating for a color rendering index of the final white light. As an example, fourth light emitted from the fourth wavelength conversion material 156Ab may have a peak wavelength ranging from 620 nm to 650 nm and a full width at half maximum of 60 nm or less. A red phosphor or a quantum dot, satisfying such wavelength conditions, may be used as the fourth wavelength conversion material 156Ab. The fourth wavelength conversion material 156Ab may include at least one phosphor selected from the group consisting of (Sr,Ca)AlSiN$_3$:Eu, CaAlSiN$_3$:Eu, and a combination thereof.

The second white light emitting device 100Ab may emit a second white light in which the third and fourth lights, converted by the third and fourth wavelength conversion materials 154Ab and 156Ab, and other unconverted third blue light are combined. In an example embodiment, the second white light may be configured to have an emission spectrum satisfying a specific condition in consideration of a color rendering index, a circadian rhythm, and the like. An example of this will be described in detail in relation to Example 3 to be described later.

Figure 3A:
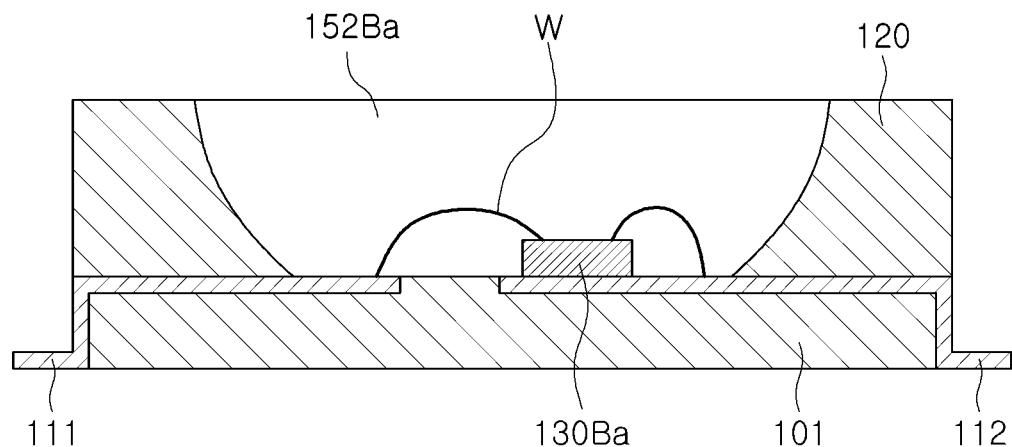
FIGS. 3A and 3B are cross-sectional views of light emitting devices, respectively adoptable to a tuning LED light source illustrated in FIG. 1, according to an embodiment.
Figure 3B:
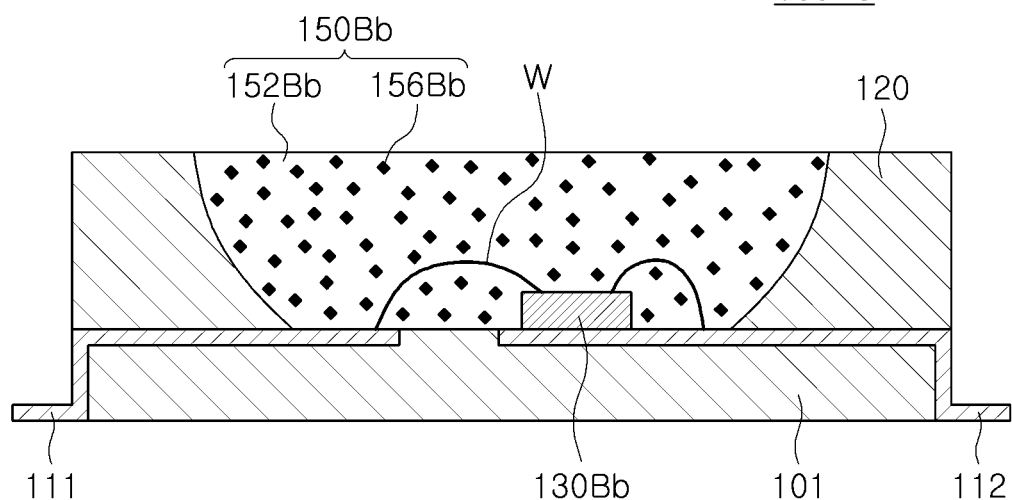

FIGS. 3A and 3B are cross-sectional views of light emitting devices 100Ba and 100Bb, respectively adoptable to a tuning LED light source 10B in the embodiment of FIG. 1.

Referring to FIG. 3A, in an example embodiment, a tuning LED light source, for example tuning LED light source 10B, may include a tuning light emitting device 100Ba emitting tuning blue light having a peak wavelength ranging from 465 nm to 495 nm. The tuning light emitting device 100Ba may include a light emitting diode 130Ba emitting tuning blue light having a peak wavelength ranging from 465 nm to 495 nm, and may be configured such that a wavelength conversion material is not contained in a light-transmitting resin 152Ba covering the light emitting diode 130Ba. Accordingly, a tuning LED light source may use blue light, having a peak wavelength ranging from 465 nm to 495 nm emitted from the light emitting diode 130Ba, as tuning blue light without wavelength conversion. The light emitting diode 130Ba may include a first conductivity-type semiconductor layer and a second conductivity-type semiconductor layer, sequentially disposed, and an active layer disposed between the first and second conductivity-type semiconductor layers. In an example embodiment, the first conductivity-type semiconductor layer and the second conductivity-type semiconductor layer may include semiconductor layers having different conductivity types, and the active layer may be a quantum well layer including In$_x$Ga$_{1-x}$N (where $0 < x \leq 1$). For example, the first conductivity-type semiconductor layer and the second conductivity-type semiconductor layer may be n-type and p-type nitride semiconductors, respectively, and the active layer may be a quantum well layer including In$_x$Ga$_{1-x}$N (where $0.215 \leq x < 0.427$). Since the tuning light emitting device 100Ba of FIG. 3A has the same or similar characteristics as the light emitting device 100Aa of FIG. 2A except that an additional wavelength conversion material is not included, duplicate descriptions will be omitted.

Referring to FIG. 3B, in an example embodiment, a tuning LED light source may include a light emitting diode 130Bb, emitting blue light having a peak wavelength ranging from 435 nm to 465 nm, and a wavelength conversion unit 150Bb including a wavelength conversion material 156Bb excited by the blue light to emit tuning blue light having a peak wavelength ranging from 465 nm to 495 nm. A light emitting diode 130Bb may adjust a content of Indium in the active layer in the light emitting diode 130Ba of FIG. 3A to emit the blue light having a peak wavelength ranging from 435 nm to 465 nm. The wavelength conversion material 156Bb may be provided as being dispersed in a light-transmitting resin 152Bb. The wavelength conversion material 156Bb may include a phosphor selected from a group consisting of $NaK(Li_3SiO_4):Eu$, $(Sr,Ca,Ba)Si_2O_2N_2:Eu$, and $(Sr,Ba)_{10}(PO_4)_6Cl_2:Eu$.

A tuning LED light source may provide the blue light having a peak wavelength ranging from 435 nm to 465 nm to adjust the intensity of a spectrum in a melanopic sensitive zone. In addition, when the tuning LED light source is combined with the first LED light source or/and the second LED light source of FIGS. 2A and 2B, the tuning LED light source may provide blue light having a predetermined range of intensity. For example, the tuning LED light source may provide blue light having peak intensity ranging from 10% to 5300%, as compared with peak intensity of blue light having a peak wavelength ranging from 435 nm to 465 nm, which may be the above-described first and third blue lights. An example embodiment may provide a human-centric LED lighting apparatus considering a human circadian rhythm using an LED light source and a tuning LED light source satisfying specific conditions. For example, an LED lighting apparatus according to an example embodiment may have various adjustment ranges of an M/P ratio, a color rendering index (CRI), and a correlated color temperature (CCT) to provide white light considering not only a human activity hour, for example, day and night, but also a surrounding environment, for example, another indoor or outdoor lighting or activity purpose.

Figure 4A:
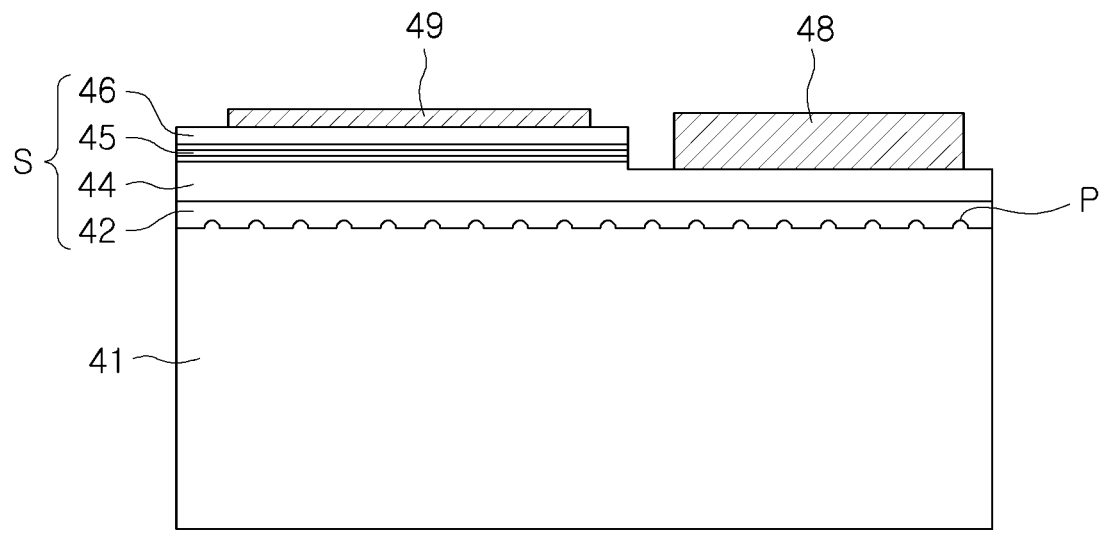
FIGS. 4A and 4B are cross-sectional views of light emitting diode chips adoptable to light emitting devices illustrated in FIGS. 2A through 3B, according to an embodiment.
Figure 4B:
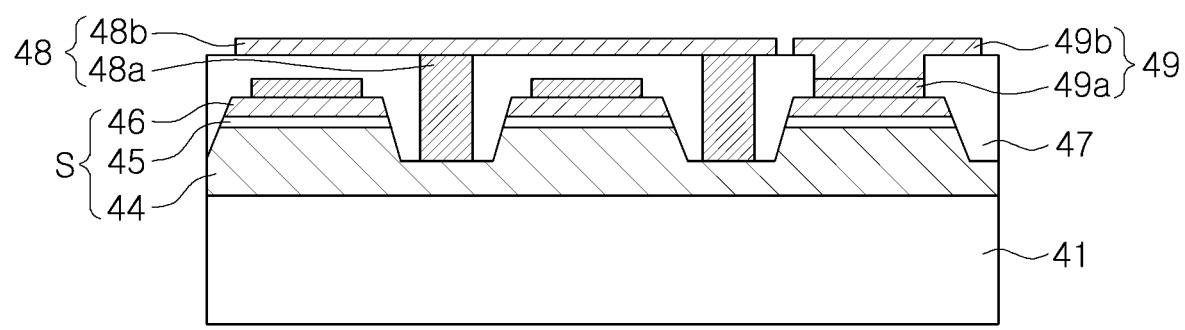

FIGS. 4A and 4B are cross-sectional views of light emitting diode chips 40A and 40B adoptable to the light emitting devices of FIGS. 2A to 2B.

Referring to FIG. 4A, as an example, a light emitting diode chip 40A may include a substrate 41, a semiconductor stack S, and a pair of electrodes, for example first electrode 48 and second electrode 49. The substrate 41 may be an insulating substrate such as sapphire. However, example embodiments are not limited thereto, and the substrate 41 may be a conductive or semiconductor substrate. For example, the substrate 41 may be SiC, Si, $MgAl_2O_4$, MgO, $LiAlO_2$, $LiGaO_2$, or GaN, other than sapphire. An unevenness P may be formed on an upper surface of the substrate 41. The unevenness P may improve the quality of single crystal grown while improving light extraction efficiency.

The semiconductor stack S may include a first conductivity-type semiconductor layer 44, an active layer 45, and a second conductive semiconductor layer 46 sequentially stacked on the substrate 41. A buffer layer 42 may be additionally disposed between the substrate 41 and the first conductivity-type semiconductor layer 44. The buffer layer 42 may include undoped $In_xAl_yGa_{1-x-y}N$ (where $0\leq x\leq 1$, $0\leq y\leq 1$). For example, the buffer layer 42 may be GaN, AlN, AlGaN, or InGaN, and may be used by combining a plurality of layers or gradually changing a composition. The first conductivity-type semiconductor layer 44 may be a nitride semiconductor satisfying n-type $In_xAl_yGa_{1-x-y}N$ (where $0\leq x<1$, $0\leq y<1$, $0\leq x+y<1$), and n-type impurities may be silicon (Si). For example, the first conductivity-type semiconductor layer 44 may include n-type GaN. The second conductivity-type semiconductor layer 46 may be a nitride semiconductor layer satisfying p-type $In_xAl_yGa_{1-x-y}N$ (where $0\leq x<1$, $0\leq y<1$, and $0\leq x+y<1$), and p-type impurities may be magnesium (Mg). For example, the second conductivity-type semiconductor layer 46 may be implemented to have a single-layer structure, but may have a multilayer structure having different compositions. The active layer 45 may have a multiple quantum well (MQW) structure in which a quantum well layer and a quantum barrier layer are alternately stacked. For example, the quantum well layer and the quantum barrier layer may be $In_xAl_yGa_{1-x-y}N$ (where $0\leq x\leq 1$, $0\leq y\leq 1$, and $0\leq x+y\leq 1$), having different compositions. As an example, the quantum well layer may be $In_xAl_yGa_{1-x}N$ (where $0<x\leq 1$), and the quantum barrier layer may be GaN or AlGaN. A thickness of each of the quantum well layer and the quantum barrier layer may be in a range of 1 nm to 50 nm. The active layer 45 is not limited to a multiple quantum well structure, and may have a single quantum well structure.

The first and second electrodes 48 and 49 may be respectively disposed in a mesa-etched region of the first conductivity-type semiconductor layer 44 and the second. conductivity-type semiconductor layer 46 to be disposed on the same surface. The first electrode 48 may include, but is not limited, a material such as Ag, Ni, Al, Cr, Rh, Pd, Ru, Mg, Zn, Pt, Au, and may be adopted as a structure including a single layer or two or more layers. As an example, the second electrode 49 may be a transparent electrode such as a transparent conductive oxide or a transparent conductive nitride, or may include graphene. The second electrode 39 may include at least one of Al, Au, Cr, Ni, Ti, and Sn.

Referring to FIG. 4B, as an example, the light emitting diode chip 40B may be understood to be similar to the light emitting diode chip 40A, illustrated in FIG. 4A, except for an electrode-related structure. Descriptions of components in the present example may refer to the descriptions of the same (or similar) components as the light emitting diode chip 40A, illustrated in FIG. 4A, unless otherwise specified. The light emitting diode chip 40B may include first and second electrodes 48 and 49, respectively connected to first and second conductivity-type semiconductor layers 44 and 46.

The first electrode 48 may include a connection electrode portion 48a, connected to a first conductivity-type semiconductor layer 44 through a second conductivity-type semiconductor layer 46 and an active layer 45, and a first electrode pad 48b connected to the connection electrode portion 48a. The connection electrode portion 48a may have the same structure as a conductive via. The connection electrode portion 48a may be surrounded by an insulating portion 47 to be electrically separated from the active layer 45 and the second conductivity-type semiconductor layer 46. The connection electrode portion 48a may be disposed in a region in which the semiconductor stack S is etched. The number, shape, pitch, and an area of contact with the first conductivity-type semiconductor layer 44 of the connection electrode portions 48a may be appropriately designed to reduce contact resistance. In addition, the connection electrode portions 48a may be arranged to form rows and columns on the semiconductor stack S to improve a current flow.

The second electrode 49 may include an ohmic contact layer 49a on the second conductivity-type semiconductor layer 46 and a second electrode pad 49b. Each of the connection electrode portion 48a and the ohmic contact layer 49a may have a single-layer structure and a multilayer structure including the first and second conductivity-type semiconductor layers 44 and 46 and a conductive material having ohmic characteristics. For example, the second electrode 49 may be formed by depositing or sputtering at least one of a metal, such as Ag, Al, Ni, and Cr, and a transparent conductive oxide (TCO) such as no. The first and second electrode pads 48 and 49 may be respectively connected to the connection electrode portion 48a and the ohmic contact layer 49a, serving as external terminals of the light emitting diode chip 40B. For example, the first and second electrode pads 48b and 49b may include Au, Ag, Al, Ti, W, Cu, Sn, Ni, Pt, Cr, NiSn, TiW, AuSn, or eutectic metals thereof.

The first and second electrodes 48 and 49 may be disposed in the same direction, and may be mounted on a lead frame, or the like, in a so-called "flip-chip" manner. The two electrodes 48 and 49 may be electrically separated from each other by the insulating portion 47. The insulating portion 47 may employ any material which has electrically insulating characteristics, and may employ any object as long as it has electrical insulation, but may employ a material having a low light absorbance. For example, the insulating portion 47 may employ a silicon oxide or a silicon nitride. As an example, the insulating portion 47 may disperse light reflective powder in a light transmitting material to form a light reflective structure In embodiments, the insulating portion 47 may have a multilayer reflective structure in which a plurality of insulating layers having different refractive indices are alternately stacked. For example, the insulating portion 47 may be a distributed Bragg reflector (DBR) in which a first insulating layer having a first refractive index and a second insulating layer having a second refractive index are alternately stacked. In the multilayer reflective structure, a plurality of insulating films having different refractive indices may be repeatedly stacked 2 to 100 times, for example, 3 to 70 times, or for example 4 to 50 times. In the multilayer reflective structure, each of the plurality of insulating layers may be an oxide or a nitride, such $SiO_2$, SiN, $SiO_xN_y$, $TiO_2$, $Si_3N_4$, $Al_2O_3$, TiN, AlN, $ZrO_2$, TiAlN, and TiSiN and combinations thereof. The refractive index of the first insulating layer and the second insulating layer may be determined in the range of about 1.4 to about 2.5, and may be smaller than a refractive index of the first conductivity-type semiconductor layer 44 and a refractive index of the substrate 41. In embodiments, the refractive index of the first insulating layer and the second insulating layer may be smaller than the refractive index of the first conductivity-type semiconductor 44 but greater than the refractive index of the substrate 41.

EXAMPLE 1

Figure 5:
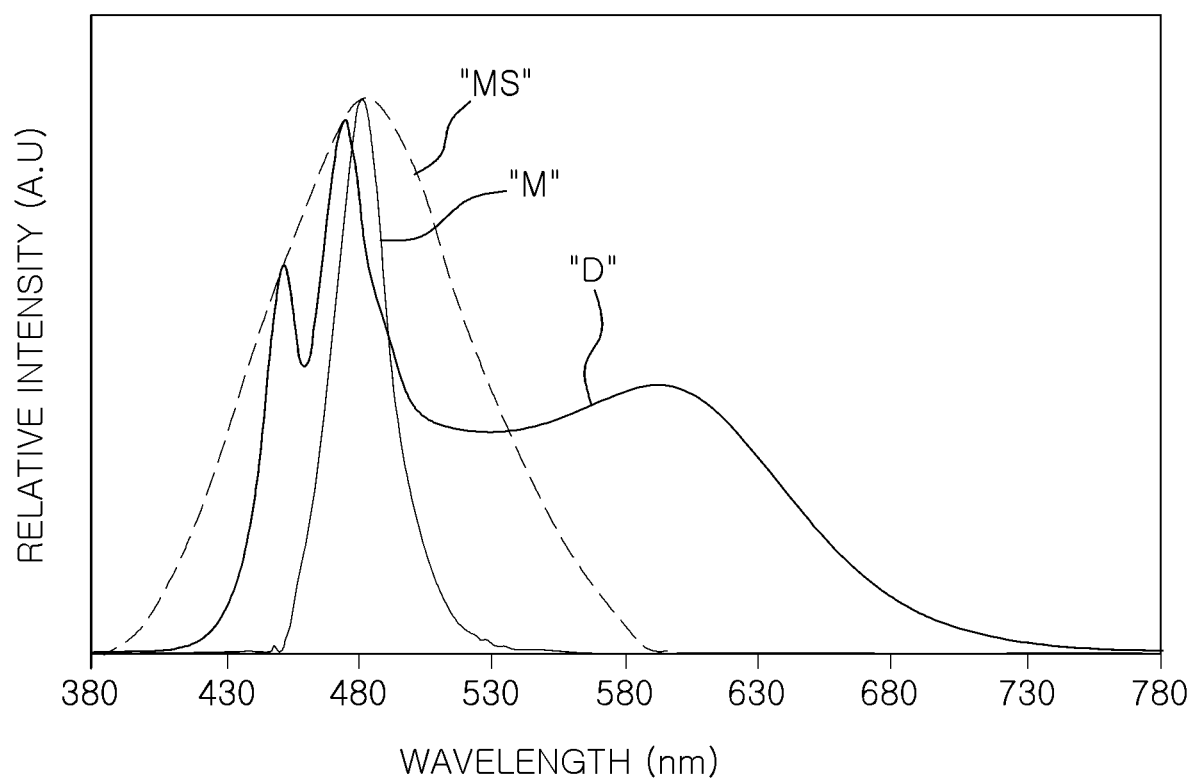
FIG. 5 is a graph illustrating emission spectra of white light D and tuning blue light M, respectively emitted from an LED light source and a tuning LED light source of an LED lighting apparatus according to an embodiment.
Figure 6:
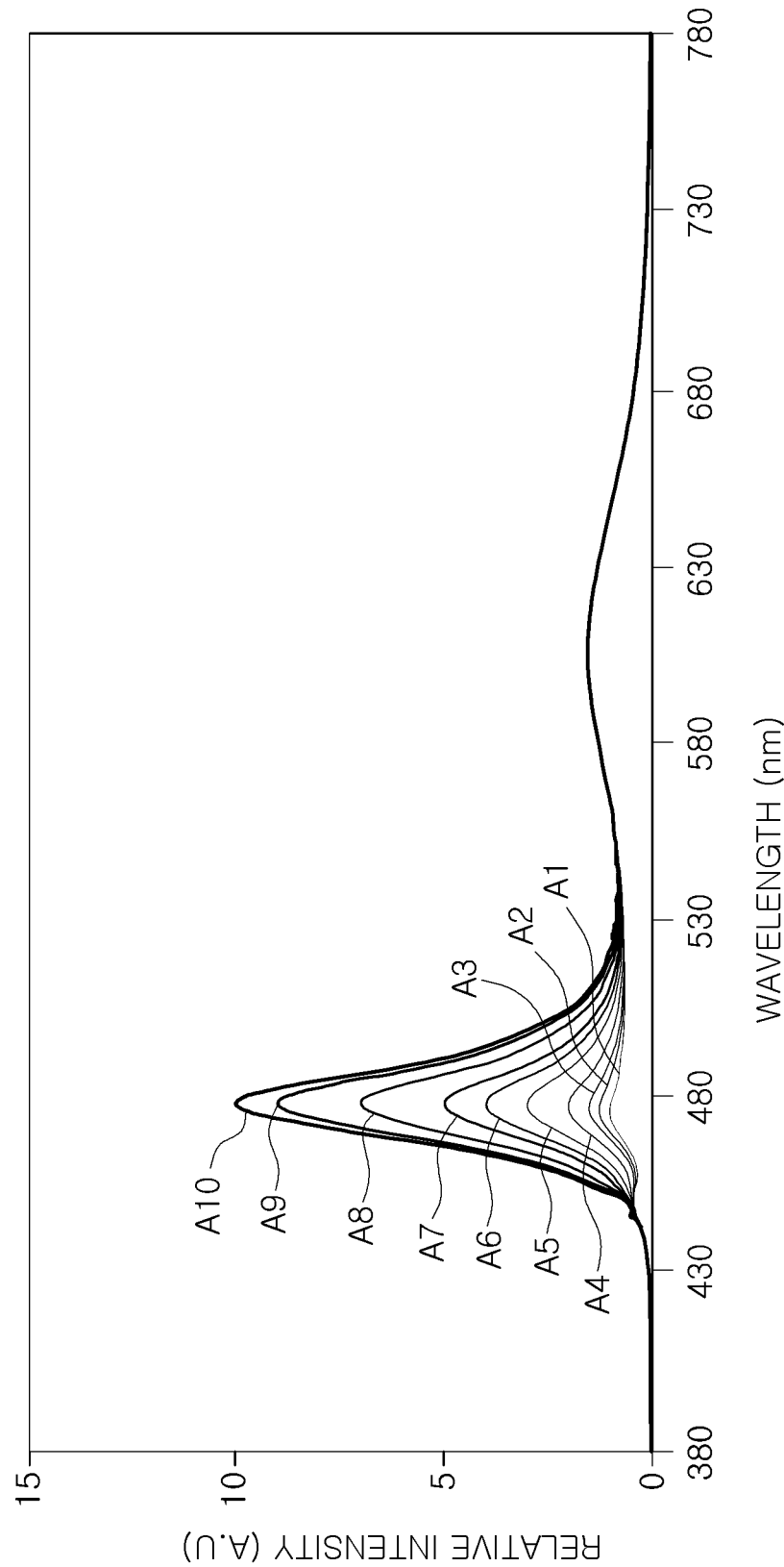
FIG. 6 is a graph illustrating emission spectra of tuned white light emitted from an LED lighting apparatus, according to an embodiment.

Hereinafter, features of the LED lighting apparatus according to Example 1 will be described in detail with reference to FIGS. 5 and 6. FIG. 5 is a graph illustrating emission spectra of white light D and tuning blue light M, respectively emitted from an LED light source and a tuning LED light source of the LED lighting apparatus according to Example 1. FIG. 6 is a graph illustrating emission spectra A1, A2, A3, A4, A5, A6, A7, A8, A9, and A10 of tuned white lights emitted from the LED lighting apparatus according to the embodiment of FIG. 5. FIG. 5 illustrates emission spectra of white light D having a correlated color temperature of 6500K and tuning blue light M having peak intensity of 480 nm.

Referring to FIG. 5, Example 1 may include a first LED light source, including for example light emitting device 100Aa as illustrated in FIG. 2A, and a tuning LED light source, including for example light emitting devices 100Ba or 100Bb as illustrated in FIG. 3A or 3B. The first LED light source may have two peak intensities in a melanopic sensitive zone MS, and may be configured to emit first white light D having a color rendering index adjusted by a wavelength conversion material. The tuning LED light source may be configured to emit tuning blue light M having peak intensity in the melanopic sensitive zone MS. For example, the first LED light source may emit first blue light having a peak wavelength ranging from 435 nm to 465 nm, and first white light D in which first light having a peak wavelength of 520 nm to 560 nm and second light having a peak wavelength of 590 nm to 655 nm are combined. In addition, for example, the tuning LED light source may emit tuning blue light M having a peak wavelength ranging from 465 nm to 495 nm. In Example 1, the driving control unit, for example driving control unit 20 of FIG. 1, may control the first light source and the tuning LED light source to generate tuned white light in which the first white light D and the turning blue light NI are combined. The tuned white light of Example 1 may have an emission spectrum having a significantly increased M/P ratio. Hereinafter, characteristics of the tuned white light of Example 1 will be described with reference to FIG. 6 and Tables 1 to 3 together.

The tuned white light of Example 1 tray have a correlated color temperature (CCT) ranging from about 3000K to 20000K, a color rendering index (CRI) ranging from about 30 to 85, and an M/P ratio ranging from about 0.6 to 2.5. In the spectrum of the tuned white light of Example 1, a ratio SB/B of peak intensity SB of the second blue light to the peak intensity B of the first blue light may be in the range of 1 to 20, and a ratio P/B of maximum peak intensity P in a band of 530 nm to 680 nm to the peak intensity B of the first blue light may be in the range of 0.5 to 3.5. In Example 1, a first M/P ratio of the first white light of the first LED light source may be in the range of about 0.6 to 1.2 or about 0.65 to 1.2, and a second M/P ratio of the tuned white light of the first LED light source may be in the range of about 0.6 to 2.5. When the second M/P ratio of the tuned white light is significantly increased, the second M/P ratio of the tuned white light may be 1.2 or more or 2 or more. For example, the second M/P ratio of the tuned white light of Example 1 may be about 1.2 to 2.4. or about 2 to 2.4, or about 2.1 to 7.35.

The above values were calculated in a test example, as follows. A spectrum of tuned white light was designed by combining first white light D, in which first blue light having a peak wavelength of 450 nm, second blue light having a peak wavelength of 480 nm, first light having a peak wavelength ranging from 520 nm to 560 nm, and second light having a peak wavelength ranging from 590 nm to 655 nm are combined, with tuning blue light having a peak wavelength of 480 nm. In this case, a correlated color temperature of the first white light D was changed to 3000K, 3500K, 4000K, 5000K, 5700K, and 6500K, and intensity SB of the tuning blue light to intensity of the first blue light was changed in the range of 0 to 20 at each of the correlated color temperatures of the first white light D to measure and calculate a correlated color temperature (CCI), an M/P ratio (M/P), and color rendering index (CRI) of the tuned white light, a ratio SB/B of peak intensity SB of the tuning blue light to peak intensity B of the first blue light, and a ratio P/B of maximum peak intensity P in the band of 530 nm to 680 nm to the peak intensity B of the first blue light. The ratio P/B of the maximum peak intensity P in the band of 530 nm to 680 nm to the peak intensity B of the first blue light is a maximum peak intensity P in the band of 530 nm to 680 nm measured under the assumption that the peak intensity B of the first blue light is 1. Some test examples, in which among characteristics of the tuned white light, upper limits and/or lower limits were exhibited, were listed in Tables 1 to 3 below.

FIG. 6 illustrates, in the above test example, spectra A1, A2, A3, A4, A5, A6, A7, A8, A9, and A10 of white light tuned while setting the correlated color temperature of the first white light D to 3000K an changing the relative intensity SB of the tuning blue light to 0, 0.1, 0.5, 1.1, 2.2, 4.4, 6.6, 8.8, 13.1, 17.5, and 19. Zero (0) was included in the relative intensity SB of the tuning blue light to check optical characteristics such as the correlated color temperature, and the like, of the first white light D before the white light was tuned. In addition, correlated color temperatures, and the like, were measured at the spectra A1, A2, A3, A4, A5, A6, A7, AS A9, and A10 of FIG. 6 and listed in Table 1. In addition, correlated color temperatures, and the like, of spectra of white light, tuned while setting correlated color temperatures of the first white light D to 5000K and 6500K and changing the relative intensity SB of the tuning blue light, were measured and listed in Tables 2 and 3. In Tables 2 and 3, calculation of spectra and measurement of optical characteristics were performed in the same manner as in FIG. 6 and Table 1.

TABLE 1

| D(CCT) | SB | CCT | M/P | CRI | SB/B | P/B |
|---|---|---|---|---|---|---|
| 3000 K | 0 | 3069 | 0.65 | 84.1 | 2.2 | 3.3 |
| | 0.1 | 3079 | 0.65 | 84.0 | 2.2 | 3.3 |
| | 0.5 | 3189 | 0.72 | 83.0 | 2.7 | 3.3 |
| | 1.1 | 3317 | 0.78 | 81.6 | 3.2 | 3.3 |
| | 2.2 | 3596 | 0.90 | 77.8 | 4.2 | 3.2 |
| | 4.4 | 4260 | 1.14 | 69.0 | 6.2 | 3.2 |
| | 6.6 | 5087 | 1.35 | 61.1 | 8.2 | 3.1 |
| | 8.8 | 6097 | 1.55 | 53.4 | 10.0 | 3.0 |
| | 13.1 | 8829 | 1.90 | 41.8 | 13.5 | 2.9 |
| | 17.5 | 13246 | 2.21 | 34.2 | 16.8 | 2.8 |
| | 19.7 | 16798 | 2.34 | 31.4 | 18.3 | 2.8 |

TABLE 2

| D(CCT) | SB | CCT | M/P | CRI | SB/B | P/B |
|---|---|---|---|---|---|---|
| 5000 K | 0 | 5018 | 1.03 | 83.6 | 1.6 | 1.0 |
| | 0.39 | 5457 | 1.14 | 80.7 | 1.9 | 1.0 |
| | 0.77 | 5940 | 1.25 | 77.2 | 2.3 | 1.0 |
| | 1.5 | 7049 | 1.45 | 70.4 | 3.0 | 1.0 |
| | 3.1 | 10059 | 1.80 | 59.0 | 4.5 | 1.0 |
| | 4.6 | 15155 | 2.11 | 50.7 | 5.9 | 1.0 |
| | 5.4 | 19480 | 2.25 | 47.4 | 6.6 | 1.0 |

TABLE 3

| D(CCT) | SB | CCT | M/P | CRI | SB/B | P/B |
|---|---|---|---|---|---|---|
| 6500 K | 0 | 6308 | 1.20 | 83.2 | 1.4 | 0.7 |
| | 0.33 | 7048 | 1.33 | 79.2 | 1.7 | 0.7 |
| | 0.67 | 7885 | 1.45 | 75.1 | 2.0 | 0.7 |
| | 1.3 | 9944 | 1.68 | 67.7 | 2.6 | 0.7 |
| | 2.7 | 17168 | 2.08 | 56.3 | 3.9 | 0.7 |

Referring to Tables 1 to 3, the tuned white light of Example 1 may have a maximum correlated color temperature, for example about 20000K or less, at a correlated color temperature of the first white light D of 5000K and relative intensity SB of tuning blue light of 5.4, and may have a minimum correlated color temperature, for example about 3000K or more, at a correlated color temperature of the first white light D of 3000K and relative intensity SB of the tuning blue light of 0.1. In addition, the tuned white light of Example 1 may have a maximum M/P ratio, for example about 2.5 or less, at a correlated color temperature of the first white light D of 3000K and relative intensity SB of the tuning blue light of 19.7, and may have a minimum M/P ratio, for example about 0.6 or more, at the correlated color temperature of the first white light of 3000K and the relative intensity SB of tuning blue light of 0.1. In addition, the tuned white light of Example 1 may have a minimum color rendering index, for example about 30 or more, at the correlated color temperature of the first white light D of 3000K and the relative intensity SB of the tuning blue light of 19.7, and may have a maximum color rendering index, for example about 85 or less, at the correlated color temperature of the first white light D of 3000K and the relative intensity SB of the tuning blue light of 0.1. In particular, a ratio SB/B of peak intensity SB of the tuning blue light to peak intensity B of the first blue light may have a maximum value, for example about 20 or less, at a correlated color temperature of 3000K and the relative intensity SB of the tuning blue light of 19.7, and may have a minimum value, for example about 1 or more, at a correlated color temperature of 6500K and relative intensity SB of the tuning blue light of 0.33. This may be understood to be a factor affecting the M/P ratio. In addition, a ratio P/B of maximum peak intensity P in a band of 530 nm to 680 nm to peak intensity B of the first blue light may have a maximum value, for example about 3.5 or less, at the correlated color temperature of 3000K and the relative intensity SB of the tuning blue light of 0.1, and may have a minimum value, for example about 0.5 or more, at the correlated color temperature of 6500K and relative intensity SB of the tuning blue light of 2.7. This may be mainly understood to be a factor affecting a color rendering index. As described above, the LED lighting apparatus according to Example 1 may select a correlated color temperature, a color rendering index, and an M/P ratio in a wide range to satisfy optical characteristics of human-centric white light required depending on a specific situation, and may obtain tuned white light having a significantly increased M/P ratio.

EXAMPLE 2

Figure 7:
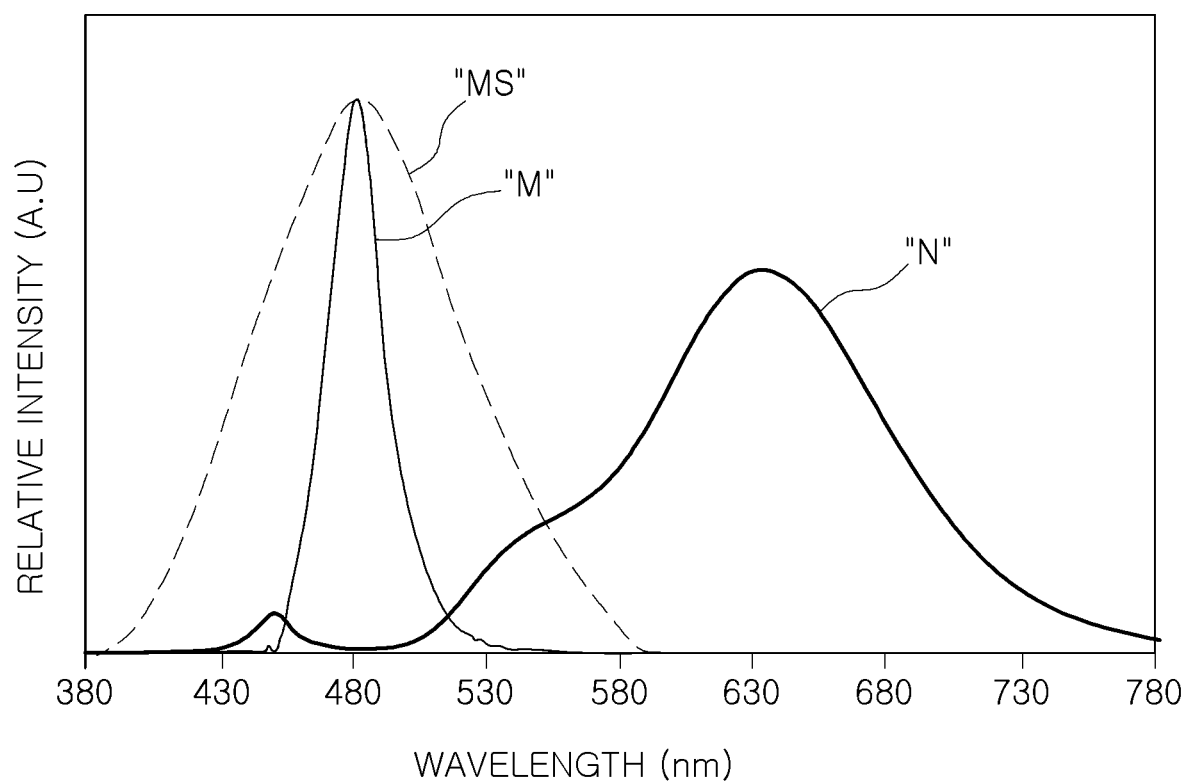
FIG. 7 is a graph illustrating emission spectra of white light N and tuning blue light M, respectively emitted from an LED light source and a tuning LED light source of an LED lighting apparatus according to an embodiment.
Figure 8:
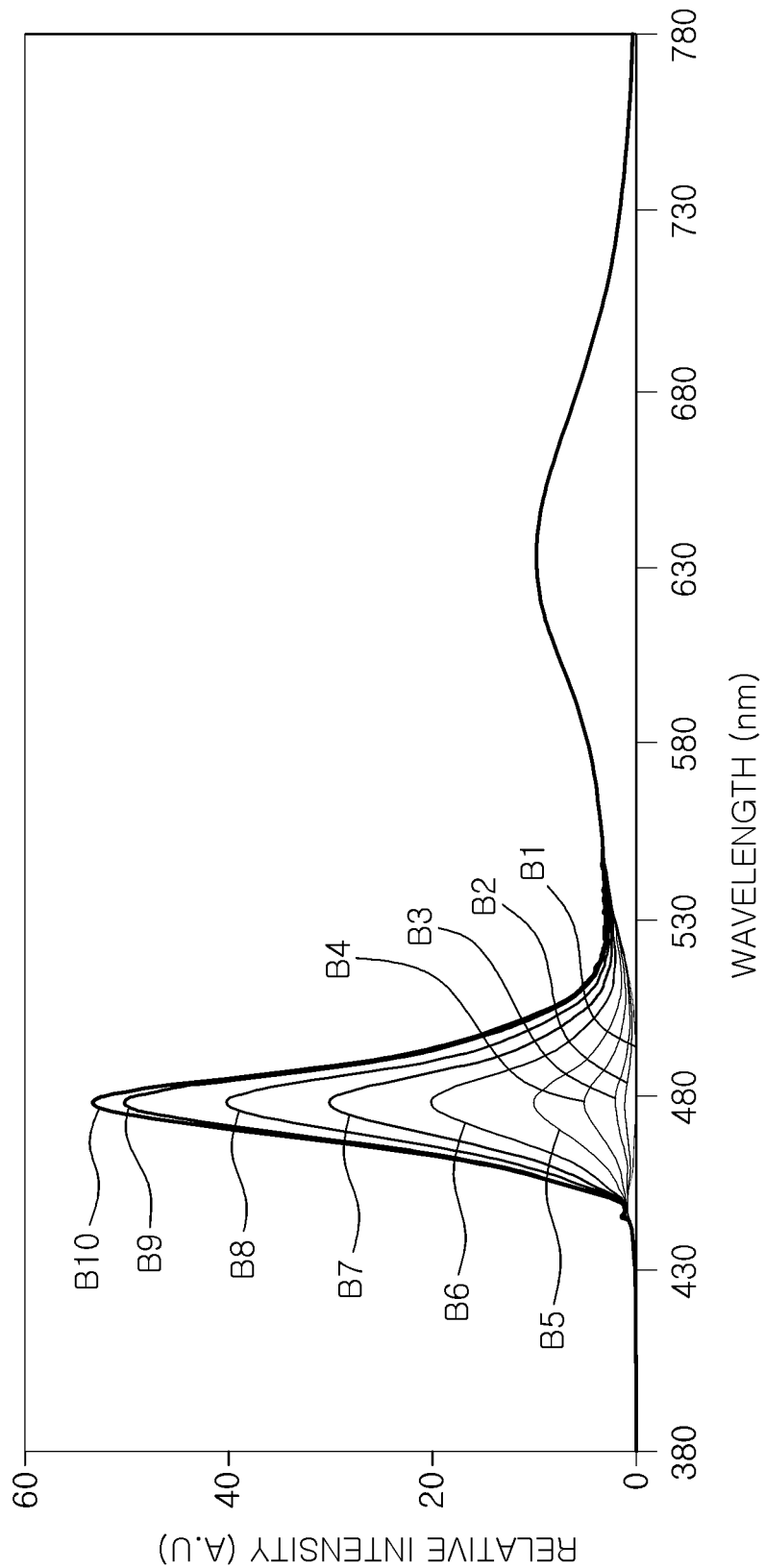
FIG. 8 is a graph illustrating emission spectra of tuned white lights emitted from an LED lighting apparatus, according to an embodiment.

Hereinafter, features of an LED lighting apparatus according to Example 2 will be described in detail with reference to FIGS. 7 and 8. FIG. 7 illustrates emission spectra of white light N and tuning blue light M, respectively emitted from an LED light source and a tuning LED light source of the LED lighting apparatus according to Example 2, and FIG. 8 illustrates emission spectra B1, B2, B3, B4, B5, B6, B7, B8, B9, and B10 of tuned white lights emitted from the LED lighting apparatus according to the: embodiment of FIG. 7. FIG. 7 illustrates emission spectra of white light N having a correlated color temperature of 1800K and tuning blue light M having peak intensity of 480 nm.

Referring to FIG. 7, Example 2 may include a second LED light source, including for example light emitting device 100Ab illustrated in FIG. 2B, and a tuning LED light source, including for example light emitting devices 100Ba or 100Bb as illustrated in FIG. 3A or 3B. The second LED light source may be configured to emit second white light N having intensity adjusted in a melanopic sensitive zone MS. The tuning, LED light source may be configured to emit tuning blue light M having peak intensity in the melanopic sensitive zone MS, as in Example 1. For example, the second LED light source may emit second white light N in which third blue light having a peak wavelength ranging from 435 nm to 465 nm, third light excited by the blue light to have a peak wavelength ranging from 540 nm to 560 nm and a full width at half maximum of 60 nm or less, and fourth light excited by the third blue light to have a peak wavelength ranging from 620 nm to 650 nm are combined. In addition, for example, the tuning LED light source may emit tuning blue light M having a peak wavelength ranging from 465 nm to 495 nm. In Example 2, the driving control unit, for example driving control unit 20 of FIG. 1, may control each of the second LED light source and the tuning LED light source to generate tuned white light in which the second white light N and the tuning blue light M are combined. The tuned white light of Example 2 may have an emission spectrum having improved color rendering while maintaining an M/P ratio at a predetermined level.

Hereinafter, characteristics of the tuned white light of Example 2 will be described with reference to FIGS. 8 and 4 to 6 together.

The tuned white light of Example 2 may have a correlated color temperature ranging from about 1800K to about 20000K, a color rendering index ranging from about 3 to about 97, and an M/P ratio ranging from about 0.2 to about 2.6. In a spectrum of the tuned, white light of Example 2, a ratio SB/B of peak intensity SB of the tuning blue light to peak intensity B of the third blue light may be in the range of 0.5 to 45, and a ratio P/B of maximum peak intensity P in a band of 530 nm to 680 nm to peak intensity B of the third blue light may be in the range of 0.5 to 10.5. In Example 2, the first M/P ratio of the second white light may be about 0.7 or less or about 0.65 or less, for example, in the range of about 0.19 to about 0.62 or about 0.5 to about 0.62, and the second M/P ratio of the tuned white light may be in the range of about 0.2 to 2.6. To secure color rendering of the tuned white color of Example 2, a color rendering index of the second white light may be about 80 or more and a color rendering index of the tuned white color of Example 2 may be about 85 or more, for example, about 85 to about 97 or about 88 to about 97, In this case, the second M/P ratio of the tuned white light may be in the range of about 0.2 to 1.1.

The above values were calculated in a test example, as follows. A spectrum of tuned white light was designed by combining second white light N, in which third blue light having a peak wavelength of 450 nm, third light emitted by a third wavelength conversion material β-SiAlON, and fourth light emitted by a fourth wavelength conversion material $(Sr,Ca)AlSiN_3$:Eu are combined, with tuning blue light having a peak wavelength of 480 nm. In this case, a correlated color temperature of the second white light N was changed to 1800K, 2200K, 2700K, 3000K, 3500K, and 4000K, and intensity SB of the tuning blue light to intensity of the third blue light was changed in the range of 0 to 53 at each of the correlated color temperatures of the second white light N to measure and calculate a correlated color temperature (CCI), an M/P ratio (M/P), and color rendering index (CRI) of the tuned white light, a ratio SB/B of peak intensity SB of the tuning blue light to peak intensity B of the third blue light, and a ratio P/B of maximum peak intensity in the band of 530 nm to 680 nm to the peak intensity B of the third blue light. The ratio P/B of the maximum peak intensity P in the band of 530 nm to 680 nm to the peak intensity B of the third blue light is maximum peak intensity P in the band of 530 nm to 680 nm measured under the assumption that the peak intensity B of the third blue light is 1. Some test examples, in which among characteristics of the tuned white light, upper limits and/or lower limits were exhibited, were listed in Tables 4 to 6 below.

FIG. 8 illustrates, in the above test example, spectra B1, B2, B3, B4, B5, B6, B7, B8, B9, and B10 of white light tuned while setting the correlated color temperature of the second white light D to 1800K an changing the relative intensity SB of the tuning blue light to 0, 1, 2, 5, 10, 20, 30, 40, 50, and 53. Zero (0) was included in the relative intensity SB of the tuning blue light to check optical characteristics such as the correlated color temperature, and the like, of the second white light N before the white light was tuned. In addition, the above-described correlated color temperatures, and the like, were measured at the spectra B1, B2, B3, B4, B5, B6, B7, B8, B9, and B10 of FIG. 8 and listed in Table 4. In addition, correlated color temperatures, and the like, of spectra of the white light, tuned while setting correlated color temperatures of the second white light N to 2700K and 4000K and changing the relative intensity SB of the tuning blue light, were measured and listed in Tables 5 and 6. In Tables 5 and 6, calculation of spectra and measurement of optical characteristics were performed in the same manner as in FIG. 8 and Table 4.

TABLE 4

| N(CCT) | SB | CCT | M/P | CRI | SB/B | P/B |
|---|---|---|---|---|---|---|
| 1800 K | 0 | 1819 | 0.19 | 84.8 | 0.4 | 10.3 |
|  | 1 | 1871 | 0.26 | 88.9 | 1.2 | 10.3 |
|  | 2 | 1924 | 0.33 | 90.2 | 2.2 | 10.2 |
|  | 5 | 2094 | 0.53 | 83.6 | 5.3 | 10.0 |
|  | 10 | 2425 | 0.82 | 69.4 | 10.1 | 9.7 |
|  | 20 | 3442 | 1.34 | 43.3 | 18.9 | 9.2 |
|  | 30 | 5455 | 1.76 | 22.4 | 26.7 | 8.7 |
|  | 40 | 8909 | 2.12 | 10.2 | 33.8 | 8.2 |
|  | 50 | 15188 | 2.43 | 4.8 | 40.2 | 7.8 |
|  | 53 | 18385 | 2.51 | 3.8 | 42.0 | 7.7 |

TABLE 5

| N(CCT) | SB | CCT | M/P | CRI | SB/B | P/B |
|---|---|---|---|---|---|---|
| 2700 K | 0 | 2764 | 0.37 | 83.7 | 0.4 | 1.8 |
|  | 1 | 3160 | 0.62 | 96.3 | 1.1 | 1.8 |
|  | 2 | 3648 | 0.84 | 89.3 | 2.1 | 1.7 |
|  | 5 | 5878 | 1.42 | 62.6 | 4.9 | 1.7 |
|  | 10 | 14180 | 2.16 | 39.8 | 9.5 | 1.7 |
|  | 11 | 17713 | 2.28 | 37.2 | 10.4 | 1.7 |

TABLE 6

| N(CCT) | SB | CCT | M/P | CRI | SB/B | P/B |
|---|---|---|---|---|---|---|
| 4000 K | 0 | 3974 | 0.62 | 84.8 | 0.7 | 0.9 |
|  | 0.25 | 4287 | 0.73 | 90.4 | 0.8 | 0.9 |
|  | 0.5 | 4633 | 0.84 | 93.6 | 0.9 | 0.9 |
|  | 0.8 | 5091 | 0.97 | 93.9 | 1.2 | 0.9 |
|  | 1 | 5424 | 1.05 | 91.8 | 1.4 | 0.9 |
|  | 2 | 7482 | 1.42 | 76.9 | 2.7 | 0.9 |
|  | 4.5 | 19579 | 2.15 | 54.3 | 5.7 | 0.9 |

Referring to Tables 4 to 6, the tuned white light of Example 2 may have a maximum correlated color temperature (about 20000K or less) at a correlated color temperature of the second white light N of 4000K and relative intensity SB of the tuning blue light of 4.5, and may have a minimum correlated color temperature, for example about 1800K or more, at a correlated color temperature of the second white light N of 1800K and relatively intensity SB of the tuning blue light of 1. In addition, the tuned white light of Example 2 may have a maximum ratio, for example about 2.6 or less, at a correlated color temperature of the second white light N of 1800K and relative intensity SB of the tuning blue light of 53, and may have a minimum M/P ratio, for example about 0.2 or more, at the correlated color temperature of the second white light N of 1800K and the relative intensity SB of tuning blue light of 1. In addition, the tuned white light of Example 2 may have a minimum color rendering index, for example about 3 or more, at the correlated color temperature of the second white light N of 1800K and the relative intensity SB of the tuning blue light of 53, and may have a maximum color rendering index, for example about 97 or less, at the correlated color temperature of the second white light D of 2700K and the relative intensity SB of the tuning blue light of 1. In particular, a ratio SB/B of peak intensity SB of the tuning blue light to peak intensity B of the third blue light may have a maximum value, for example about 45 or less, at a correlated color temperature of 1800K and the relative intensity SB of the tuning blue light of 53, and may have a minimum value, for example about 0.5 or more, at a correlated color temperature of 4000K and relative intensity SB of the tuning blue light of 0.25. In addition, a ratio P/B of maximum peak intensity P in a band of 530 nm to 680 rim to the peak intensity B of the third blue light may have a maximum value, for example about 10.5 or less, at the correlated color temperature of 1800K and the relative intensity SB of the tuning blue light of 1, and may have a minimum value, for example about 0.5 or more, at a correlated color temperature of 4000K and relatively intensity of the tuning blue light of 4.5. As described above, the LED lighting apparatus according to Example 2 may obtain tuned white light, capable of selecting a correlated color temperature and color rendering index in a wide range while maintaining an M/P ratio at a predetermined level, to satisfy optical characteristics of human-centric white light required depending on a specific situation.

Figure 9:
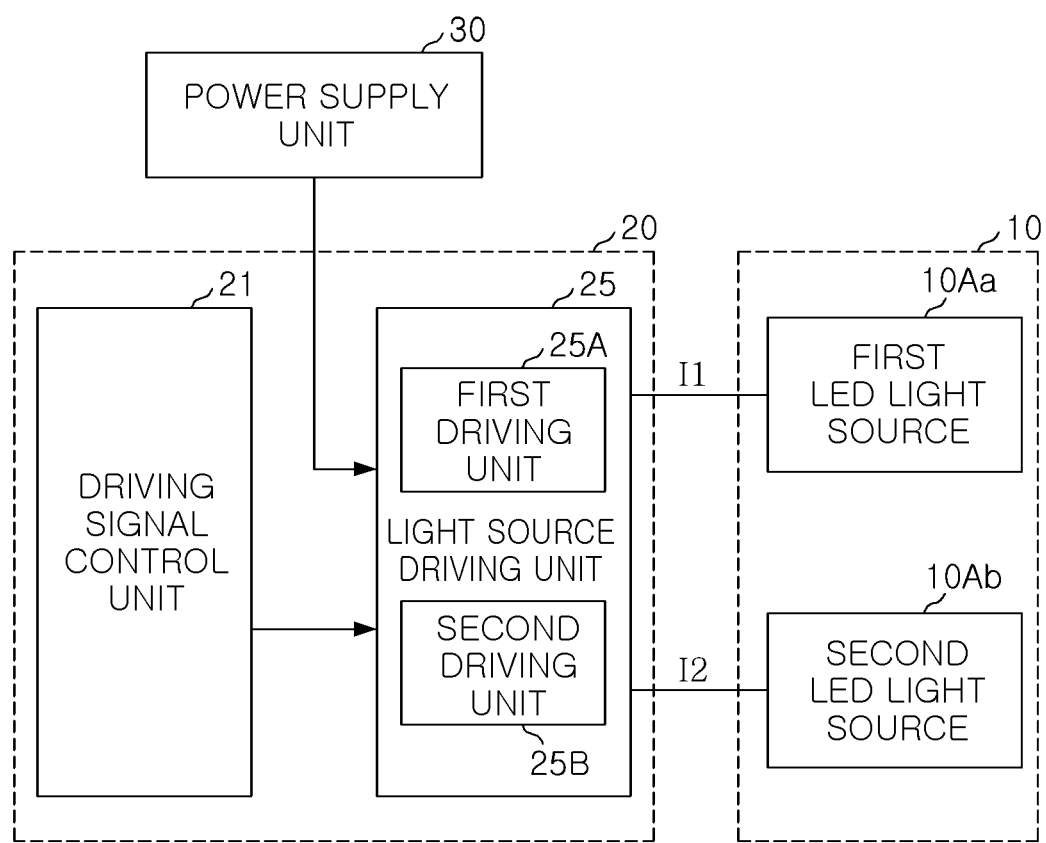
FIG. 9 is a block diagram of an LED lighting apparatus according to an embodiment.
Figure 10A:
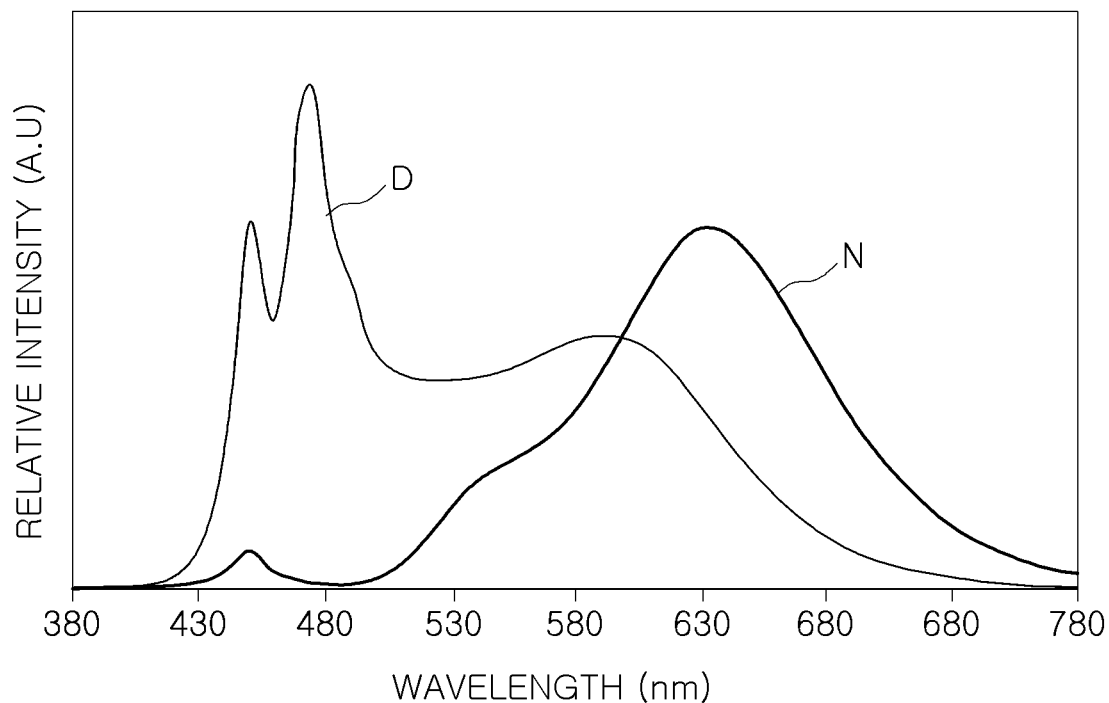
FIG. 10A is a graph illustrating emission spectra of first white light D and second white light N, respectively emitted from a first LED light source and a second LED light source of an LED lighting apparatus illustrated in FIG. 9, according to an embodiment.
Figure 10B:
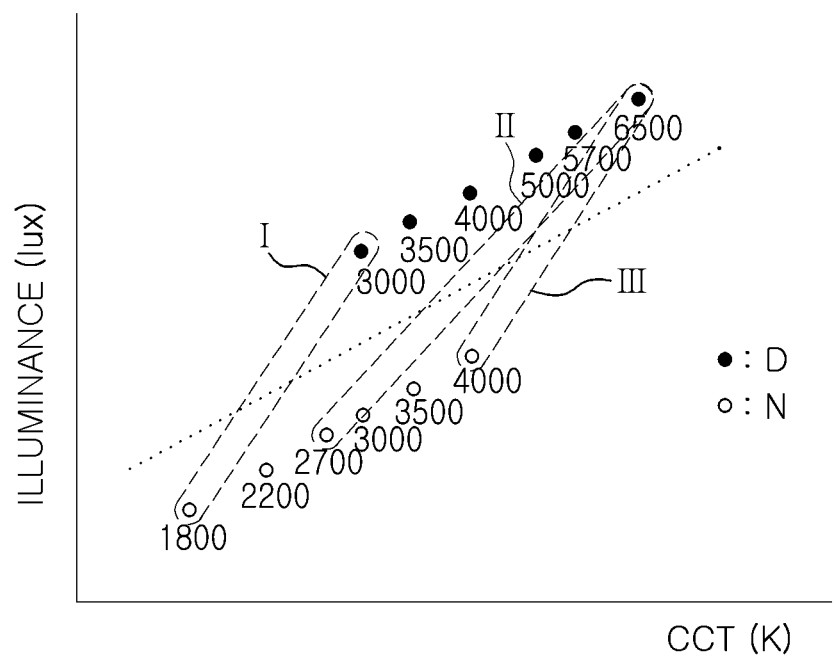
FIG. 10B is a graph illustrating selective control of a first LED light source and a second LED light source of an LED lighting apparatus illustrated in FIG. 9, according to an embodiment.

FIG. 9 is a block diagram of an LEI) lighting apparatus according to an example embodiment, FIG. 10A is a graph illustrating emission spectra of first white light D and second white light N, respectively emitted from a first LED light source and a second LED light source of the LED lighting apparatus according to the embodiment of FIG. 9, and FIG. 10B is a graph illustrating selective control of the first LED light source and the second LED light source of the LED lighting apparatus according to the embodiment of FIG. 9. FIG. 10A illustrates emission spectra of the first white light D having a correlated color temperature of 6500K and the second white light N having a correlated color temperature of 1800K.

Referring to FIG. 9, an LED lighting apparatus according to an example embodiment may include the first and second LED light sources of FIGS. 2A and 2B, and may not include a tuning LED light source. For example, a first LED light source 10Aa may include a first light emitting diode emitting first blue light having a peak wavelength ranging from 435 nm to 465 nm, a second light emitting diode emitting second blue light having a peak wavelength ranging from 465 nm to 495 nm, a first wavelength conversion material excited by the first and second blue light to emit first light having a peak wavelength ranging from 520 nm to 560 nm, and a first wavelength conversion material excited by the first and second blue lights to emit second light having a peak wavelength ranging from 600 nm to 645 nm, and may be configured to emit first white light. A second LED light source 10Ab may include a third light emitting diode emitting third blue light having a peak wavelength ranging from 435 nm to 465 nm, a third wavelength conversion material excited by the third blue light to emit third light having a peak wavelength ranging from 540 nm to 560 nm and a full width at half maximum of 60 nm or less, and a fourth wavelength material excited by the third blue light to emit fourth light having a peak wavelength ranging from 620 nm to 650 nm, and may be configured to emit second white light. A driving control unit 20 may control currents I1 and I2, respectively applied to the first LED light source 10Aa and the second LED light source 10Ab, to generate tuned white light. In an example embodiment, the LED lighting apparatus may combine the first and second LED light sources, satisfying a specific condition, to provide human-centric white light in which a correlated color temperature, an M/P ratio, and the like are adjusted. Since components of the LED lighting apparatus illustrated in FIG. 9 have the same (or similar) features as those described in FIG. 1, duplicate descriptions will be omitted.

Referring to FIG. 10A together, in an example embodiment, the first LED light source 10Aa may have two peak intensities in a melanopic sensitive zone MS as in Example 1 and may be configured to emit first white light D having a color rendering index adjusted by a wavelength conversion material, and the second LED light source 10Ab may be configured to emit second white light N having intensity adjusted in the melanopic sensitive zone MS as in Example 2. In an example embodiment, the driving control unit 20 may control each of the first and second LED light sources to generate tuned white light in which the first and second white lights D and N are combined. The tuned white light of an example embodiment may have an emission spectrum having an adjusted M/P ratio while maintaining a color rendering index at a high level.

Referring to FIG. 10B together, the first LED light source 10Aa and the second LED light source 10Ab of an example embodiment may be combined by varying correlated color temperatures. Each of the first LED light source 10Aa and the second LED light source 10Ab may have a correlated color temperature in a specific range, and the first white light D of the first LED light source 10Aa may be, but is not limited to being, implemented in a higher correlated color temperature range than the second white light N of the second LED light source 10Ab. For example, the first white light D may have a correlated color temperature ranging from 3000K to 6500K, and the second white light N may have a correlated color temperature ranging from 1800K to 4000K. Test examples I, II, and III, capable of indicating upper and lower limits of characteristics of the tuned white light of Example 3 to be described later, among the correlated color temperatures of the first white light D and the second white light N illustrated in FIG. 10B, are listed in Tables 7 to 9 below.

EXAMPLES 3

Figure 11:
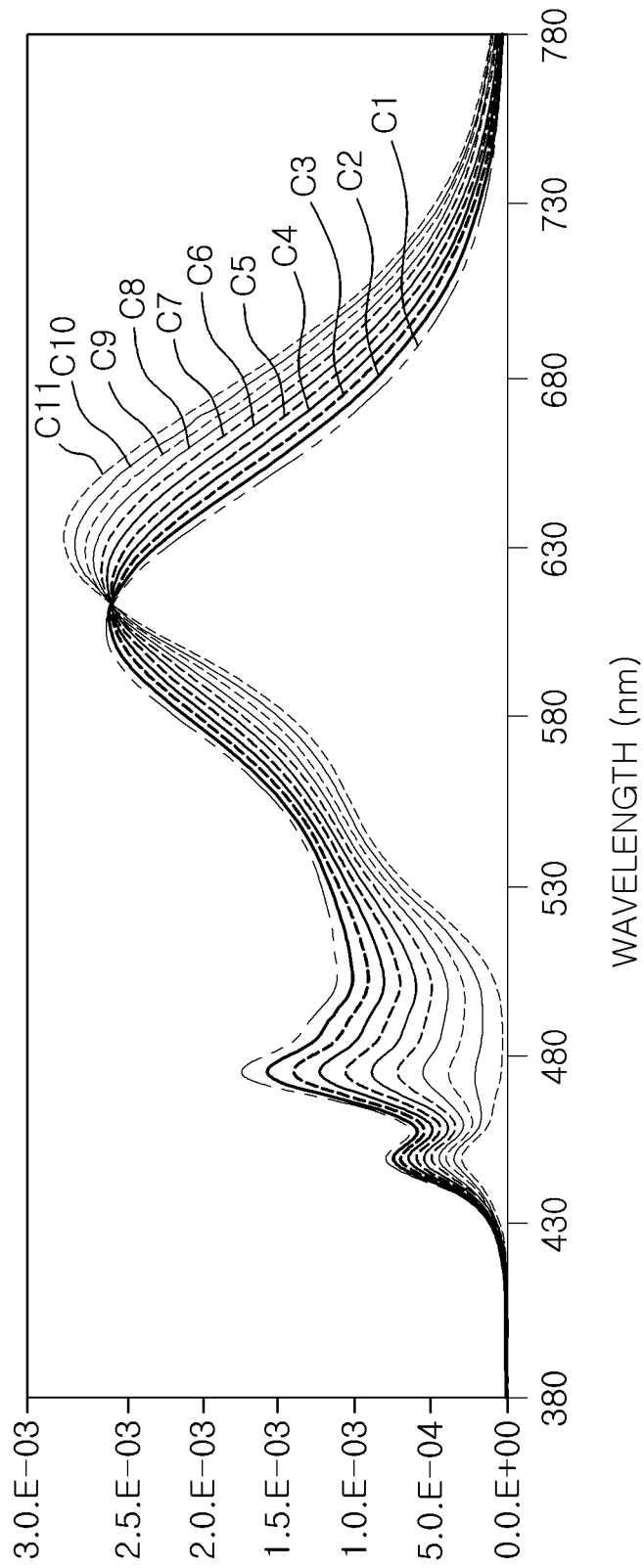
FIG. 11 is a graph illustrating emission spectra of tuned white lights emitted from an LED lighting apparatus illustrated in FIG. 9, according to an embodiment.

Hereinafter, characteristics of the tuned white light according to Example 3 will be described with reference to FIGS. 11 and Tables 7 to 9 together. FIG. 11 illustrates emission spectra C1, C2, C3, C4, C5, C6, C7, C8, C9, C10, and C11 of tuned white lights emitted from an LED lighting apparatus according to Example 3.

The tuned white light of Example 3 may have a correlated color temperature ranging from about 1800K to about 6500K, a color rendering index ranging from about 80 to about 95, and an M/P ratio ranging from about 0.2 to about 1.2. In a spectrum of the tuned white light of Example 3, a ratio SB/B of peak intensity SB of the second blue light, for example a peak intensity ranging from 465 nm to 495 nm, to peak intensity B of third blue light, for example peak intensity ranging from 435 nm to 465 nm, may be in the range of about 0.2 to about 2.5, and a ratio P/B of maximum peak intensity P in a band of 530 nm to 680 nm band to the peak intensity B of the third blue light may be in the range of about 0.5 to about 9. The above values were calculated in a test example, as follows. First white light D and second white light N were designed in the same manner as in the test example of the first and Example 2s. In this case, a correlated color temperature of the first white light D was changed to 3000K, 3500K, 4000K, 5000K, 5700K, and 6500K, a correlated color temperature of the second white light N was changed to 1800K, 2200K, 2700K, 3000K, 3500K, and 4000K, and a ratio of intensity of the first white light D to intensity of the second white light N was changed to 1:0, 0.9:0.1, 0.8:0.2, 0.7:0.3, 0.6:0.4, 0.5:0.5, 0.4:0.6, 0.3:0.7, 0.2:0.8, 0,1:0.9, and 0:1 in a combination of the correlated color temperatures, so that each value was measured and calculated. The ratio of the intensity of the first white light D and the intensity of the second white light N represents an intensity ratio when a sum of the intensity of the first white light D and the intensity of the second white light N is 1. Some test examples, in which upper and lower limits, among characteristics of the tuned white light of Example 3, were exhibited, are listed in Tables 7 to 9 below.

FIG. 11 illustrates spectra C1, C2, C3, C4, C5, C6, C7, C8, C9, C10, and C11 of white light tuned while setting a correlated color temperature of first white light D to 3000K, setting a correlated color temperature of second white light N to 1800K, and changing relative intensities of the first white light D and the second white light N. Zero (0) was included in each of the intensities to check optical characteristics of the correlated color temperature, and the like, of the first and second white lights D and N before tuning the first and second white lights D and N. In addition, the above-mentioned correlated color temperature, and the like, were measured in the spectra C1, C2, C3, C4, C5, C6, C7, C8, C9, C10, and C11 of FIG. 11 and listed in Table 7. In addition, correlated color temperature, and the like, of tuned white lights in a test example, in which correlated color temperatures of first and second white lights D and N are respectively 6500K and 2700K, and a test example, in which correlated color temperatures of first and second white lights D and N are respectively 6500K and 4000K, were measured and listed in Tables 8 and 9, respectively. In Tables 8 and 9, calculation of the spectra and measurement of the optical characteristics were performed in the same manner as in FIG. 11 and Table 7.

TABLE 7

| D:N (CCT) | D:N (intensity) | CCT | M/P | CRI | SBZB | P/B |
|---|---|---|---|---|---|---|
| 3000 K:1800 K | 1:0 | 3069 | 0.65 | 84.1 | 2.2 | 3.3 |
| | 0.9:1 | 2933 | 0.62 | 85.1 | 2.1 | 3.5 |
| | 0.8:0.2 | 2799 | 0.58 | 86.0 | 2.0 | 3.7 |
| | 0.7:0.3 | 2666 | 0.54 | 86.9 | 1.9 | 4.0 |
| | 0.6:0.4 | 2536 | 0.50 | 87.8 | 1.8 | 4.4 |
| | 0.5:0.5 | 2409 | 0.46 | 88.5 | 1.6 | 4.8 |
| | 0.4:0.6 | 2285 | 0.42 | 89.2 | 1.5 | 5.4 |
| | 0.3:0.7 | 2164 | 0.37 | 89.5 | 1.2 | 6.1 |
| | 0.2:0.8 | 2046 | 0.31 | 89.1 | 1.0 | 7.0 |

TABLE 7-continued

| D:N (CCT) | D:N (intensity) | CCT | M/P | CRI | SBZB | P/B |
|---|---|---|---|---|---|---|
| | 0.1:0.9 | 1931 | 0.26 | 87.4 | 0.6 | 8.1 |
| | 0:1 | 1819 | 0.19 | 84.8 | 0.4 | 9.8 |

TABLE 8

| D:N (CCT) | D:N (intensity) | CCT | M/P | CRI | SB/B | P/B |
|---|---|---|---|---|---|---|
| 6500 K:2700 K | 1:0 | 6308 | 1.20 | 83.2 | 1.4 | 0.7 |
| | 0.9:1 | 5735 | 1.12 | 85.7 | 1.3 | 0.7 |
| | 0.8:0.2 | 5223 | 1.04 | 88.1 | 1.2 | 0.8 |
| | 0.7:0.3 | 4767 | 0.96 | 90.0 | 1.1 | 0.8 |
| | 0.6:0.4 | 4363 | 0.88 | 92.3 | 1.0 | 0.9 |
| | 0.5:0.5 | 4005 | 0.79 | 94.1 | 0.9 | 1.0 |
| | 0.4:0.6 | 3689 | 0.71 | 94.2 | 0.8 | 1.1 |
| | 0.3:0.7 | 3411 | 0.63 | 92.8 | 0.7 | 1.2 |
| | 0.2:0.8 | 3167 | 0.54 | 90.4 | 0.5 | 1.4 |
| | 0.1:0.9 | 2953 | 0.46 | 87.3 | 0.4 | 1.6 |
| | 0:1 | 2764 | 0.37 | 83.7 | 0.4 | 1.8 |

TABLE 9

| D:N (CCT) | D:N (intensity) | CCT | M/P | CRI | SB/B | P/B |
|---|---|---|---|---|---|---|
| 6500 K:4000 K | 1:0 | 6308 | 1.20 | 83.2 | 1.4 | 0.7 |
| | 0.9:1 | 5967 | 1.14 | 85.8 | 1.3 | 0.7 |
| | 0.8:0.2 | 5657 | 1.08 | 88.3 | 1.1 | 0.7 |
| | 0.7:0.3 | 5375 | 1.01 | 90.4 | 1.0 | 0.7 |
| | 0.6:0.4 | 5119 | 0.95 | 92.1 | 0.9 | 0.7 |
| | 0.5:0.5 | 4884 | 0.90 | 92.0 | 0.8 | 0.7 |
| | 0.4:0.6 | 4669 | 0.84 | 91.5 | 0.7 | 0.7 |
| | 0.3:0.7 | 4473 | 0.78 | 90.6 | 0.7 | 0.7 |
| | 0.2:0.8 | 4292 | 0.73 | 89.1 | 0.7 | 0.8 |
| | 0.1:0.9 | 4126 | 0.67 | 87.1 | 0.6 | 0.8 |
| | 0:1 | 3974 | 0.62 | 84.8 | 0.6 | 0.8 |

Referring to Tables 7 to 9, the tuned white light of Example 3 may have a maximum correlated color temperature, for example about 6500K or less, at correlated color temperatures of first and second white lights D and N of 6500K and 4000K and a ratio of intensity of the first white light D to intensity of the second white light N of 0.9:0.1, and may have a minimum correlated color temperature, for example about 1800K or more, at correlated color temperatures of first and second white lights D and N of 3000K and 1800K and a ratio of intensity of the first white light D to intensity of the second white light N of 0.1:0.9. In addition, the tuned white light of Example 3 may have a maximum M/P ratio, for example about 1.2 or less, at correlated color temperatures of the first and second white lights D and N of 6500K and 4000K and a ratio of the intensity of the first white light D to the intensity of the second white lights N of 0.9:0.1, and may have a minimum M/P ratio, for example about 0.2 or more, at correlated color temperatures of the first and second white light D and N of 3000K and 1800K and a ratio of the intensity of the first white light D to the intensity of the second white light N of 0.1:0.9. In addition, the tuned white light of Example 3 may have a maximum color rendering index, for example about 95 or less, at correlated color temperatures of the first and second white lights D and N of 6500K and 2700K and a ratio of the intensity of first white light D to the intensity of the second white light N of 0.5:0.5, and may maintain about 80 or more of a color rendering index in an entire correlated color temperature range of the first and second white lights D and N.

A ratio SB/B of peak intensity SB ranging from 465 nm to 495 nm to peak intensity B ranging from of 435 nm to 465 nm may have a maximum value, for example about 2.5 or less, at correlated color temperatures of 3000K and 1800K and a ratio of the intensity of the first white light 1) to the intensity of the second white light N of 0.9:0.1, and may have a minimum value, for example about 0.2 or more, at correlated color temperatures of 6500K and 2700K and a ratio of the intensity of the first white light D to the intensity of the second white light N of 0.1:0.9. In addition, a ratio P/B of maximum peak intensity P in a band of 530 nm to 680 nm to peak intensity B ranging from 435 nm to 465 nm may have a maximum value, for example about 9 or less, at correlated color temperatures of the first and second white lights D and N of 3000K and 1800K and a ratio of the intensity of the first white light D to the intensity of the second white light N of 0.1:0.9, and may have a minimum value, for example about 0.5 or more, at correlated color temperatures of the first and second white lights D and N of 6500K and 2700K and a ratio of the intensity of the first white light D to the intensity of the second white light N of 0.9:0.1. As described above, the LED lighting apparatus according to Example 3 may obtain tuned white light, capable of selecting a correlated color temperature and color rendering index in a wide range while maintaining an M/P ratio at a predetermined level, to satisfy optical characteristics of human-centric white light required depending on a specific situation.

First white light D and second white light N, satisfying specific spectral conditions, may be used to obtain the above-described tuned white light of Example 3. Hereinafter, this will be described with reference to FIGS. 10A and 12.

Returning to FIG. 10A, in the spectrum of the first white light D emitted from the first LED light source, the peak intensity of the second blue light, for example the peak intensity ranging from 465 nm to 495 nm, may be 50% or more, as compared with the peak intensity of blue light, for example the peak intensity ranging from 435 nm to 465 nm. To achieve a BLH reduction effect, a peak intensity ratio of the first and second blue lights may be selected to be 70% or more and, further, the peak intensity of the second blue light may be selected to be greater than the peak intensity of the first blue light. In this case, the wavelength and the intensity ratio of the second blue light may be adjusted in the range in which a color rendering index is maintained at 80 or more and, in detail, 90 or more. From a color rendering point of view, maximum intensity in a band of 520 nm to 560 nm may be in the range of 50 to 160% of the peak intensity of the second blue light.

Figure 12:
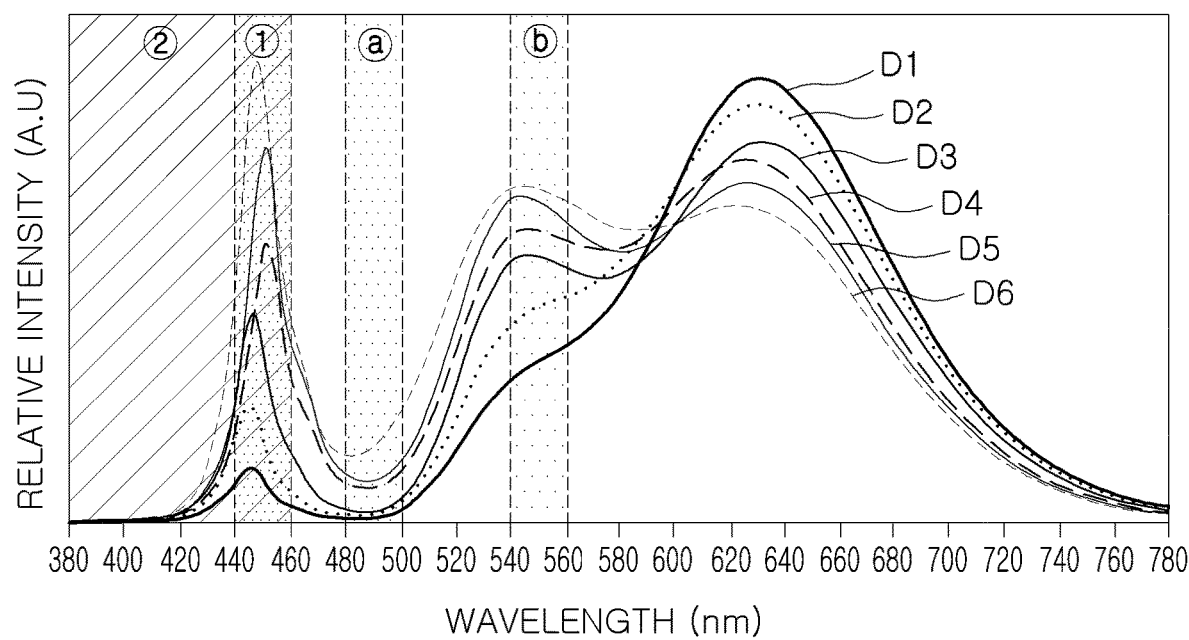
FIG. 12 is a graph illustrating emission spectra of second white lights of a light emitting device adoptable as a second LED light source illustrated in FIG. 9, according to an embodiment.

FIG. 12 is a graph illustrating emission spectra of second white lights of a light emitting device adoptable as a second LED light source in the embodiment of FIG. 9.

FIG. 12 illustrates emission spectra D1, D2, D3, D4, D5, and D6 in which correlated color temperatures 1800K, 2200K, 2700K, 3000K, 3500K, and 4000K are designed to be different by combining a third wavelength conversion material (β-SiAlON) and a fourth wavelength conversion material (CSr,Ca)AlSiN₃:Eu) together with a light emitting diode emitting third blue light having a wavelength of 445 nm and adjusting a mixing ratio of first and second wavelength conversion materials.

Referring to FIG. 12, second white light of the second LED light source adoptable to the present disclosure may satisfy two spectral conditions. A first spectral condition may be defined as a proportion of light ① emitted from a blue LED, for example light emitted from an unconverted blue LED, in light ② in an entire blue wavelength band in a spectrum of final white light. In this case, integral light intensity of the light ① may be expressed as an integral quantity of a spectrum corresponding to a band of 440 nm to 460 nm, and integral light intensity of the light ② may be expressed as an integral quantity of a spectrum corresponding to a band of 380 nm to 500 nm. The integral light intensity of the light ① may have a constant value in proportion to the integral light intensity of the light ②, while the integral light intensity of the light ② may have a relatively small value because light intensity is reduced in a melanopic-related wavelength band as compared with the white light according to a conventional manner. As can be seen from Table 10 below, a ratio ①/② depending on the first spectral condition may be in the range of 50% to 65%.

The second spectral condition may be defined as a ratio of light ⓐ in a cyan band to light ⓑ in a green band in a spectrum of final white light. In this case, the integral light intensity of the light ⓐ may be expressed as an integral quantity of a spectrum corresponding to a band of 480 nm to 500 nm, and integral light intensity of the light ⓑ may be expressed as an integral quantity of a spectrum corresponding to a band of 540 nm to 550 nm. The integral light amount of the light ⓐ may be light intensity of light related to a melanopic ratio, and may have a relatively small value as the melanopic ratio is decreased. As can be seen from Table 10 below, the ratio ⓐ/ⓑ depending on the second spectral condition may be 30% or less.

TABLE 10

| Item | D1 | D2 | D3 | D4 | D5 | D6 |
|---|---|---|---|---|---|---|
| CCT (K) | 1800 | 2200 | 2700 | 3000 | 3500 | 4200 |
| Spectral Condition 1 (①/②) | 55% | 58% | 63% | 57% | 58% | 56% |
| Spectral Condition 2 (ⓐ/ⓑ) | 4.1% | 5.1% | 5.3% | 14% | 16% | 25% |

As described above, second white light of a second LED light source adoptable to example embodiments may have a spectrum in which integral light intensity of 440 nm to 460 nm is in the range of 50% to 65% of integral light intensity of 380 nm to 500 nm, and integral light intensity of 480 nm to 500 nm is in the range of 30% or less of integral light intensity of 540 nm to 560 nm.

The second spectral condition may be further classified as a value related to a melanopic ratio, according to a correlated color temperature. For example, when the correlated color temperature of white light is in the range of 1800K to 2800K, integral light intensity of 480 nm to 500 nm may be in the range of 6% or less of the integral light intensity of 540 nm to 560 nm. In addition, when the correlated color temperature of white light is in the range of 2800K to 4000K, the integral light intensity of 480 nm to 500 nm may be in the range of 10% to 30% of the integral light intensity of 540 nm to 560 nm.

Figure 13:
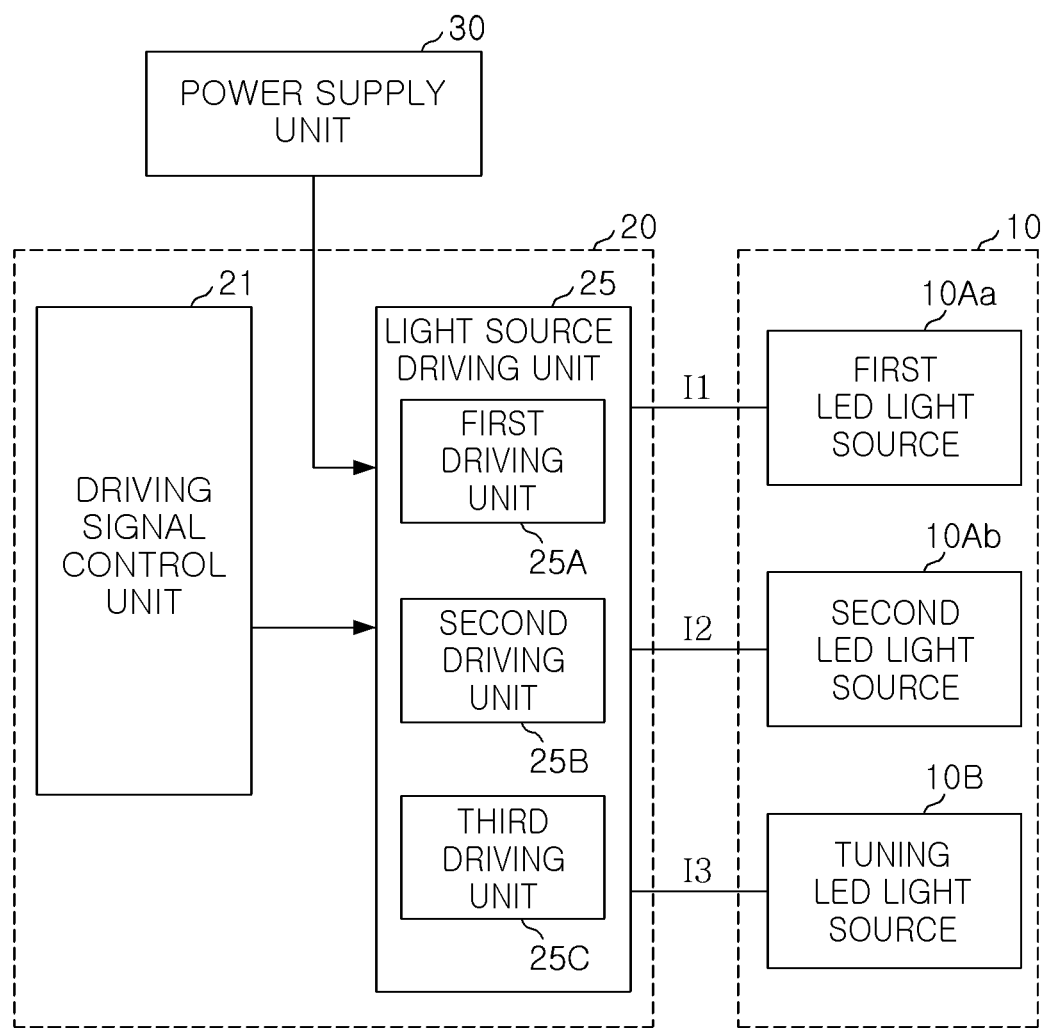
FIG. 13 is a block diagram of an LED lighting apparatus according to an embodiment.
Figure 14:
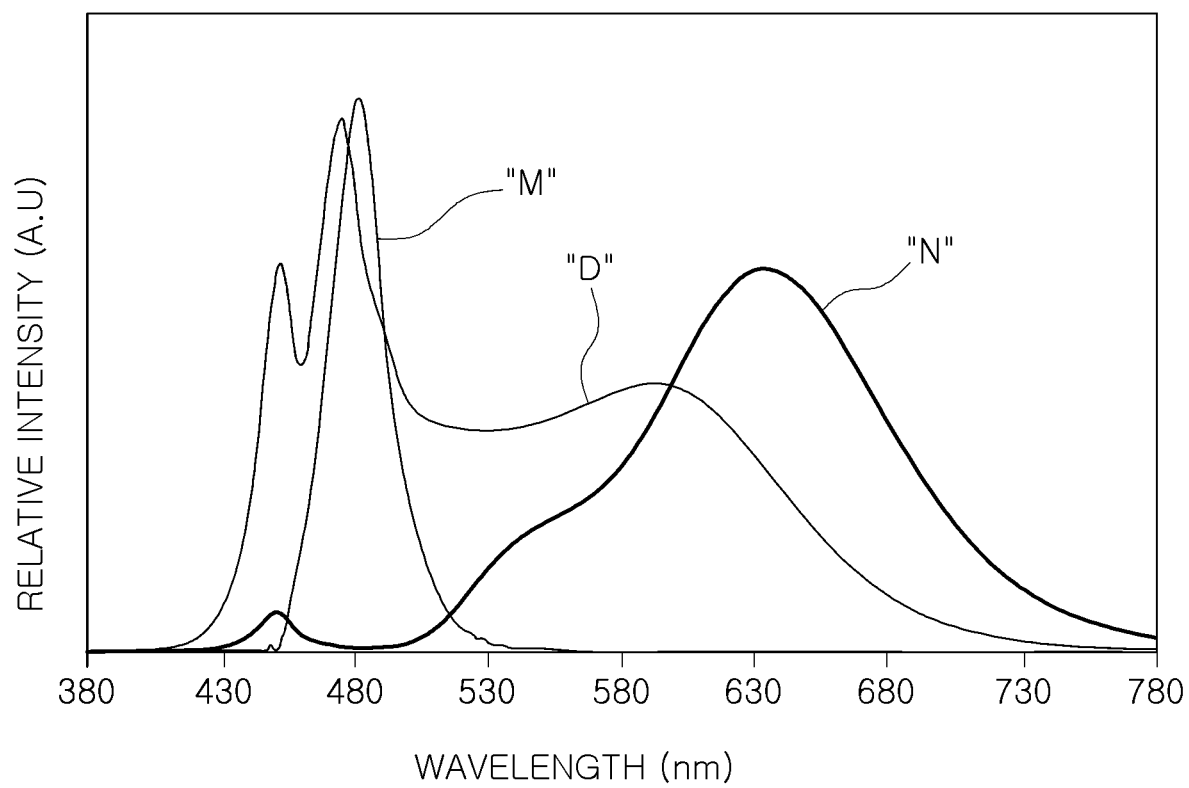
FIG. 14 is a graph illustrating first white light second white light N, and tuning blue light M, respectively emitted from a first LED light source, a second LED light source, and a tuning LED light source of an LED lighting apparatus illustrated in FIG. 13, according to an embodiment.

FIG. 13 is a block diagram of an LED lighting apparatus according to an example embodiment, and FIG. 14 is a graph illustrating first white light D, second white light N, and tuning blue light M, respectively emitted from a first LED light source, a second LED light source, and a tuning LED light source of the LED lighting apparatus according to the embodiment of FIG. 13. FIG. 14 illustrates emission spectra of the first white light D having a correlated color temperature of 6500 K, the second white light N having a correlated color temperature of 1800 K, and the tuning blue light M having peak intensity of 480 nm.

Referring to FIG. 13, an LED lighting apparatus according to an example embodiment may include a tuning LED light source, in addition to first and second LED light sources. In an example embodiment, a driving control unit 20 may control currents I1, I2, and I3, respectively applied to a first LED light source 10Aa, a second LED light source 10Ab, and a tuning LED light source 1013, to generate tuned white light. In an example embodiment, the LED lighting apparatus may provide a human-centric white light having an M/P ratio or a color rendering index adjusted at a high level. Since the first and second LED light sources and the tuning LED light sources of FIG. 13 have the same characteristics as the light sources of the Example 1 through Example 3, duplicate descriptions will be omitted.

Referring to FIG. 14 together, in an example embodiment, a first LED light source 10Aa may have two peak intensities in a melanopic sensitive zone MS as in Example 1 and may be configured to emit first white light D having color rendering adjusted by a wavelength conversion material, and a second LED light source 10Ab may be configured to emit second white light N having intensity adjusted in the melanopic sensitive zone MS as in Example 2. In addition, the tuning LED light source 10B may be configured to emit tuning blue light M having peak intensity in the melanopic sensitive zone MS. The tuned white light of an example embodiment may have an emission spectrum in which an M/P ratio or a color rendering index are adjusted at a high level.

EXAMPLE 4

Figure 15:
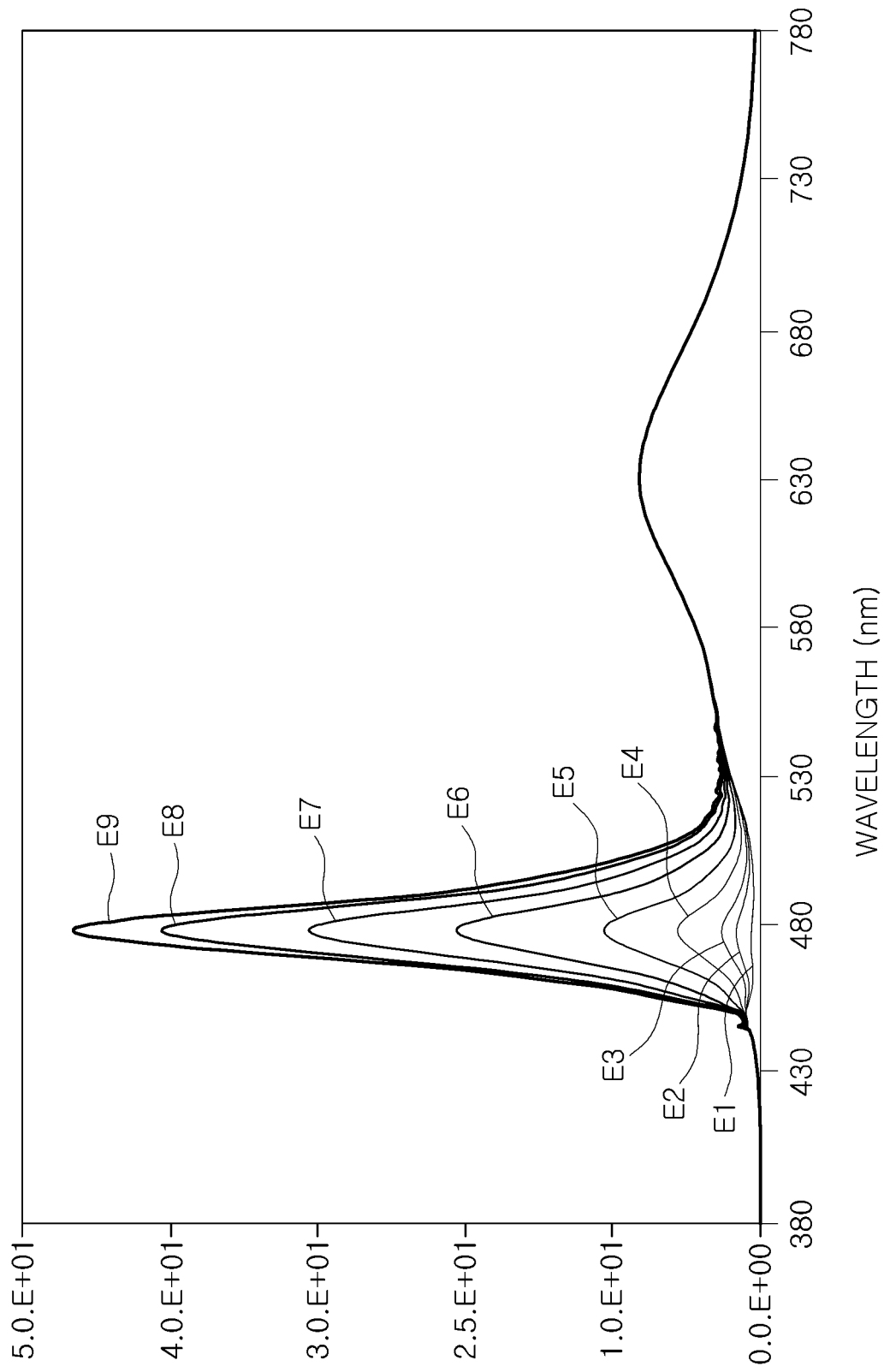
FIG. 15 is a graph illustrating emission spectra of tuned white lights emitted from an LED lighting apparatus illustrated in FIG. 13, according to an embodiment.

Hereinafter, characteristics of tuned white light according to Example 4 will be described with reference to FIG. 15 and Tables 11 to 13. FIG. 15 illustrates emission spectra E1, E2, E3, E4, ES, E6, E7, E8, and E9 of tuned white light emitted from the LED lighting apparatus according to the embodiment of FIG. 13.

The tuned white light of Example 4 may have a correlated color temperature ranging from about 1900K to about 20000K, a color rendering index ranging from about 7 to about 91, and an M/P ratio ranging from about 0.3 to about 2.6. In a spectrum of the tuned white light of Example 4, a ratio SB/B of peak intensity SB of second blue light, for example peak intensity ranging from 465 nm to 495 nm, to peak intensity B of the first or third blue light, for example peak intensity ranging from 435 nm to 465 nm, may be in the range of about 1 to about 35, and a ratio P/B of maximum peak intensity P in a band of 530 nm to 680 nm to the peak intensity B of the first or third blue light may be in the range of about 0.5 to about 9. Similarly to the test example of Example 3, the above values were measured and calculated by changing a correlated color temperature of first white light D to 3000K, 3500K, 4000K, 5000K, 5700K, and 6500K, changing a correlated color temperature of second white light N to 1800K, 2200K, 2700K, 3000K, 3500K, and 4000K, changing a ratio of intensity of the first white light D to intensity of the second white light N in each correlated color temperature combination to 1:0, 0.9:0.1, 0.8:0.2, 0.7:0.3, 0.6:0.4, 0.5:0.5, 0.4:0.6, 0.3:0.7, 0.2:0,8, 0,1:0.9, and 0:1, and changing the intensity SB of tuning blue light to the intensity B of the first blue light to be in the range of 0 to 46. Some test examples, in which upper and lower limits, among characteristics of the tuned white light of Example 3, were exhibited, are listed in Tables 11 to 13 below.

FIG. 15 illustrates, in test examples of Example 4, spectra E1, E2, E3, E4, ES. E6, E7, ES, and E9 of white light tuned while setting a correlated color temperature of the first white light D to 3000K, setting a correlated color temperature of the second white light N to 1800K, setting relative intensity of the first white light D and the second white light N to 10:90, and changing the intensity of the tuning blue light. Zero (0) was included in the relative intensity SB of the tuning blue light to check optical characteristics such as the correlated color temperature, and the like, of the first white light D before the white light was tuned. In addition, correlated color temperatures, and the like of tuned white lights in a test example, in which correlated color temperatures of first and second white lights D and N were respectively 6500K and 4000K, and a test example, in which correlated color temperatures of first and second white lights D and N were respectively 6500K and 2700K, are listed in Tables 12 and 13. In Tables 12 and 13, the calculation of the spectra and the measurement of the optical properties were performed in the same manner as in FIG. 15 and Table 11.

TABLE 11

| D:N (CCT) | D:N (intensity) | SB | CCT | M/P | CRI | SB/B | P/B |
|---|---|---|---|---|---|---|---|
| 3000 K:1800 K | 0.1:0.9 | 0 | 1931 | 0.26 | 87.4 | 0.6 | 8.1 |
| | | 1 | 1994 | 0.33 | 90.3 | 1.6 | 8.1 |
| | | 2 | 2060 | 0.41 | 89.3 | 2.5 | 8.0 |
| | | 5 | 2273 | 0.62 | 80.5 | 5.3 | 7.8 |
| | | 10 | 2711 | 0.94 | 65.5 | 9.6 | 7.4 |
| | | 20 | 4222 | 1.49 | 37.8 | 17.2 | 6.8 |
| | | 30 | 7216 | 1.94 | 18.7 | 23.6 | 6.3 |
| | | 40 | 12656 | 2.32 | 10.0 | 29.2 | 5.9 |
| | | 46 | 19031 | 2.51 | 7.3 | 32.1 | 5.6 |

TABLE 12

| D:N (CCT) | D:N (intensity) | SB | CCT | M/P | CRI | SB/B | P/B |
|---|---|---|---|---|---|---|---|
| 6500 K:4000 K | 0.9:0.1 | 0 | 5967 | 1.14 | 85.8 | 1.3 | 0.7 |
| | | 0.25 | 6465 | 1.23 | 82.9 | 1.5 | 0.7 |
| | | 0.5 | 7009 | 1.33 | 79.8 | 1.7 | 0.7 |
| | | 1 | 8257 | 1.50 | 73.8 | 2.2 | 0.7 |
| | | 2 | 11706 | 1.82 | 63.6 | 3.1 | 0.7 |
| | | 3 | 17812 | 2.10 | 55.9 | 4.1 | 0.7 |
| | | 3.2 | 19687 | 2.15 | 54.5 | 4.3 | 0.7 |

TABLE 13

| D:N (CCT) | D:N (intensity) | SB | CCT | M/P | CRI | SB/B | P/B |
|---|---|---|---|---|---|---|---|
| 6500 K:2700 K | 0.5:0.5 | 0 | 4005 | 0.79 | 94.1 | 0.9 | 0.99 |
| | | 0.5 | 6465 | 1.23 | 82.9 | 1.5 | 0.99 |
| | | 1 | 7009 | 1.33 | 79.8 | 1.7 | 0.98 |
| | | 2 | 8257 | 1.50 | 73.8 | 2.2 | 0.97 |
| | | 3 | 11706 | 1.82 | 63.6 | 3.1 | 0.96 |
| | | 5 | 17812 | 2.10 | 55.9 | 4.1 | 0.95 |
| | | 6 | 19687 | 2.15 | 54.5 | 4.3 | 0.94 |

Referring to Tables 11 to 13, the tuned white light of Example 4 may have a maximum correlated color temperature, for example about 20000K or less, at correlated color temperatures of first and second white colors D and N of 6500K and 4000K and intensity SB of tuning blue light of 3.2, and may have a minimum correlated color temperature, for example about 1900K or more, at correlated color temperatures of the first and second white light D and N of 3000K and 1800K and a ratio of intensity of the first white light D to intensity of the second white light of 0.1:0.9. In addition, the tuned white light of Example 4 may have a maximum MIP ratio, for example about 2.6 or less, at color temperatures of the first and second white lights D and N of 3000K and 1800K, the ratio of the intensity of the first white light D to the intensity of the second white light N of 0.1:0.9, and intensity SB of the tuning blue light of 46, and may have a minimum M/P ratio, about 0.3 or more, at color temperatures of the first and second white lights D and N of 3000K and 1800K, the ratio of the intensity of the first white light D to the intensity of the second white light N of 0.1:0.9, and intensity SB of the tuning blue light of 1. In addition, the tuned white light of Example 4 may have a maximum color rendering index, for example about 91 or less, at color temperatures of the first and second white lights D and N of 3000K and 1800K, the ratio of the intensity of the first white light D to the intensity of the second white light N of 0.1:0.9, and intensity SB of the tuning blue light of 1, and may have a minimum a color rendering index, for example about 7 or more, at color temperatures of the first and second white lights D and N of 3000K and 1800K, the ratio of the intensity of the first white light D to the intensity of the second white light N of 0.1:0.9, and intensity SB of the tuning blue light of 46.

In addition, a ratio SB/B of peak intensity SB ranging from 465 nm to 495 nm, which may be a peak intensity of tuning blue light, to peak intensity B ranging from 435 nm to 465 nm may have a maximum value, for example about 35 or less, at color temperatures of the first and second white lights D and N of 3000K and 1800K, the ratio of the intensity of the first white light D to the intensity of the second white light N of 0.1:0.9, and intensity SB of the tuning blue light of 46, and may have a minimum value, for example about 1 or more, at color temperatures of the first and second white lights D and N of 3000K and 1800K, the ratio of the intensity of the first white light D to the intensity of the second white light N of 0.1:0,9, and intensity SB of the tuning blue light of 1. In addition, a ratio P/B of maximum peak intensity P in a band of 530 nm to 680 nm to peak intensity B ranging from 435 nm to 465 nm may have a maximum value, for example about 9 or less, at color temperatures of the first and second white lights D and N of 3000K and 1800K, the ratio of the intensity of the first white light D to the intensity of the second white light N of 0.1:0.9, and intensity SB of the tuning blue light of 1, and may have a minimum value, for example about 0.5 or more, at color temperatures of the first and second white lights and N of 6500K and 4000K, the ratio of the intensity of the first white light D to the intensity of the second white light N of 0.1:0.9, and intensity SB of the tuning blue light of 32.

As described above, the LED lighting apparatus according to Example 4 may obtain tuned white light, capable of selecting an M/P ratio or a color rendering index to a specific level, to satisfy optical characteristics of human-centric white light required depending on a specific situation. For example, an M/P ratio of the tuned white light of Example 4 may satisfy a value of 2 or more in the case in which the intensity of the first white light is 50 or more when the sum of the intensities of the first and second white light is 100. In embodiments, the color rendering index of the tuned white light of Example 4 may satisfy a value of 80 or more in the case in which the intensity of the first white light is less than 50 when the sum of the intensities of the first and second white light is 100.

As described above, according to example embodiments, a human-centric LED lighting apparatus, adjusting a spectrum in a region of 465 nm to 495 nm to adjust secretion of melatonin hormone involved in human biorhythm, may be provided.

While example embodiments have been shown and described above, it will be apparent to those of ordinary skill in the art that modifications and variations could be made without departing from the scope of the present inventive concept as defined by the appended claims.

What is claimed is:

1. A light emitting diode (LED) lighting apparatus comprising:
   a first LED light source configured to emit first white light and including:
      a first light emitting diode configured to emit first blue light having a peak wavelength in a range of 435 nm to 465 nm,
      a second light emitting diode configured to emit second blue light having a peak wavelength in a range of 465 nm to 495 nm,
      a first wavelength conversion material configured to be excited by the first blue light and the second blue light and to emit first light having a peak wavelength in a range of 520 nm to 560 nm, and
      a second wavelength conversion material configured to be excited by the first and second blue lights and to emit second light having a peak wavelength ranging from 600 nm to 645 nm;
   a second LED light source configured to emit a second white light and including:
      a third light emitting diode configured to emit third blue light having the peak wavelength in the range of 435 nm to 465 nm,
      a third wavelength conversion material configured to be excited by the third blue light and to emit third light having a peak wavelength in a range of 540 nm to 560 nm and having a full width at half maximum of 60 nm or less, and
      a fourth wavelength conversion material configured to be excited by the third blue light and to emit fourth light having a peak wavelength in a range of 620 nm to 650 nm;
   a tuning LED light source configured to emit tuning blue light having the peak wavelength in the range of 465 nm to 495 nm; and
   a driving control unit configured to control currents respectively applied to the first LED light source, the second LED light source, and the tuning LED light source to generate tuned white light.

2. The LED lighting apparatus of claim 1, wherein the driving control unit is further configured to drive the tuning LED light source and the first LED light source to generate the tuned white light, and
   wherein, in a spectrum of the tuned white light, a ratio of a peak intensity of the second blue light to a peak intensity of the first blue light is in a range of 1 to 20, and a ratio of a maximum peak intensity of a band of 530 nm to 680 nm to the peak intensity of the first blue light is in a range of 0.5 to 3.5.

3. The LED lighting apparatus of claim 1, wherein the driving control unit is further configured to drive the tuning LED light source and the second LED light source to generate the tuned white light, and
   wherein, in a spectrum of the tuned white light, a ratio of a peak intensity of the tuning blue light to a peak intensity of the third blue light is in a range of 0.5 to 45, and a ratio of a maximum peak intensity of a band of 530 nm to 680 nm to the peak intensity of the third blue light is in a range of 0.5 to 10.5.

4. The LED lighting apparatus of claim 1, wherein the driving control unit is further configured to drive the first LED light source and the second LED light source to generate the tuned white light, and wherein, in a spectrum of the tuned white light, a ratio of a peak intensity SB in a band of 465 nm to 495 nm to a peak intensity in a band of 435 nm to 465 nm is in a range of 0.2 to 2.5, and a ratio of a maximum peak intensity in a range of 530 nm to 680 nm to the peak intensity in the band of 435 nm to 465 nm is in a range of 0.5 to 9.

5. The LED lighting apparatus of claim 1, wherein the driving control unit is further configured to drive the first LED light source, the second LED light source, and the tuning LED light source to generate the tuned white light, and wherein in a spectrum of the tuned white light, a ratio of a peak intensity in a band of 465 nm to 495 nm to a peak intensity in a band of 435 nm to 465 nm is in a range of 1 to 35, and a ratio of a maximum peak intensity in a band of 530 nm to 680 nm to the peak intensity in the band of 435 nm to 465 nm is in a range of 0.5 to 9.

6. The LED lighting apparatus of claim 5, wherein, based on an intensity of the first white light being 50 or more and a sum of the intensity of the first white light and an intensity of the second white light being 100, a melanopic/photopic (M/P) ratio of the tuned white light is 2 or more.

7. The LED lighting apparatus of claim 5, wherein based on an intensity of the first white light being less than 50 and a sum of the intensity of the first white light and intensity of the second white light is 100, a color rendering index of the tuned white light is 80 or more .

8. A light emitting diode (LED) lighting apparatus comprising:

a first LED light source configured to emit first white light and including:
a first light emitting diode configured to emit first blue light having a peak wavelength in a range of 435 nm to 465 nm,
a second light emitting diode configured to emit second blue light having a peak wavelength in a range of 465 nm to 495 nm,
a first wavelength conversion material configured to be excited by the first and second blue lights and to emit first light having a peak wavelength in a range of 520 nm to 560 nm, and
a second wavelength conversion material configured to be excited by the first and second blue lights and to emit second light having a peak wavelength in a range of 600 nm to 645 nm;

a second LED light source configured to emit second white light and including:
a third light emitting diode configured to emit third blue light having the peak wavelength in the range of 435 nm to 465 nm,
a third wavelength conversion material configured to be excited by the third blue light and to emit third light having a peak wavelength in a range of 540 nm to 560 nm and having a full width at half maximum of 60 nm or less, and
a fourth wavelength conversion material configured to be excited by the third blue light and to emit fourth light having a peak wavelength in a range of 620 nm to 650 nm; and a driving control unit configured to control currents respectively applied to the first LED light source and the second LED light source to generate tuned white light.

9. The LED lighting apparatus of claim 8, wherein, in a spectrum of the first white light, a peak intensity of the second blue light is 50% or more as compared with a peak intensity of the first blue light, and wherein, in a band of 520 nm to 560 nm, a maximum intensity of the first white light is in a range of 50% to 160% of the peak intensity of the second blue light.

10. The LED lighting apparatus of claim 8, wherein a correlated color temperature of the second white light is in a range of 1800K to 4200K, and wherein, in a spectrum of the second white light, an integral light intensity of 440 nm to 460 nm is in a range of 50% to 65% of an integral light intensity of 380 nm to 500 nm, and an integral light intensity of 480 nm to 500 nm is in a range of 30% or less of an integral light intensity of 540 nm to 560 nm.

11. The LED lighting apparatus of claim 8, wherein, in a spectrum of the tuned white light, a ratio of a peak intensity in a band of 465 nm to 495 nm to a peak intensity in a band of 435 nm to 465 nm is in a range of 0.2 to 2.5, and a ratio of a maximum peak intensity in a band of 530 nm to 680 nm to the peak intensity in the band of 435 nm to 465 nm is in a range of 0.5 to 9.

12. A light emitting diode (LED) lighting apparatus comprising:

an LED light source configured to emit white light having a first melanopic/photopic (M/P) ratio;
a tuning LED light source configured to emit tuning blue light having a peak wavelength in a range of 465 nm to 495 nm; and
a driving control unit configured to control currents respectively applied to the LED light source and the tuning LED light source to generate tuned white light having a second M/P ratio higher than the first M/P ratio.

13. The LED lighting apparatus of claim 12, wherein the LED light source includes:
a first light emitting diode configured to emit first blue light having a peak wavelength in a range of 435 nm to 465 nm,
a second light emitting diode configured to emit second blue light having the peak wavelength in the range of 465 nm to 495 nm,
a first wavelength conversion material configured to be excited by the first and second blue lights and to emit first light having a peak wavelength in a range of 520 nm to 560 nm, and
a second wavelength conversion material configured to be excited by the first and second blue lights and to emit second light having a peak wavelength in a range of 590 nm to 655 nm.

14. The LED lighting apparatus of claim 13, wherein the first M/P ratio is in a range of 0.65 to 1.2, and wherein the second M/P ratio is 1.2 or more.

15. The LED lighting apparatus of claim 12, wherein the LED light source includes:
at least one light emitting diode configured to emit third blue light having the peak wavelength in the range of 435 nm to 465 nm,
a third wavelength conversion material configured to be excited by the third blue light and to emit third light having a peak wavelength in a range of 540 nm to 560 nm and having a full width at half maximum of 60 nm or less, and a fourth wavelength conversion material configured to be excited by the third blue light and to emit fourth light having a peak wavelength in a range of 620 nm to 650 nm.

16. The LED lighting apparatus of claim 15, wherein a color rendering index of the tuned white light is 85 or more, wherein the first M/P ratio is in a range of 0.19 to 0.62, and wherein the second M/P ratio is in a range of 0.2 to 1.1.

17. The LED lighting apparatus of claim 12, wherein the tuning LED light source includes a light emitting diode configured to emit the tuning blue light having the peak wavelength in the range of 465 nm to 495 nm.

18. The LED lighting apparatus of claim 17, wherein the light emitting diode includes a first conductivity-type semiconductor layer, a second conductivity-type semiconductor layer on the first conductivity-type semiconductor layer, and an active layer disposed between the first conductivity-type semiconductor layer and the second conductivity-type semiconductor layer, and wherein the active layer includes $In_xGa_{1-x}N$, where $0.215 \leq x < 0.427$.

19. The LED lighting apparatus of claim 12, wherein the tuning LED light source includes:

a light emitting diode configured to emit blue light having a peak wavelength in a range of 435 nm to 465 nm, and a wavelength conversion material configured to be excited by the blue light and to emit the tuning blue light having the peak wavelength in a range of 465 nm to 495 nm.

20. The LED lighting apparatus of claim 19, wherein the wavelength conversion material includes a phosphor from among $NaK(Li_3SiO_4):Eu$, $(Sr,Ca,Ba)Si_2O_2N_2:Eu$, and $(Sr,Ba)_{10}(PO_4)_6Cl_2:Eu$.

* * * * *